United States Patent
Downing, Jr. et al.

(10) Patent No.: US 8,502,452 B2
(45) Date of Patent: Aug. 6, 2013

(54) HIGH-STABILITY LIGHT SOURCE SYSTEM AND METHOD OF MANUFACTURING

(75) Inventors: John P. Downing, Jr., Port Townsend, WA (US); Dubravko Ivan Babic, Santa Clara, CA (US)

(73) Assignee: USL Technologies, LLC, Port Townsend, WA (US)

( * ) Notice: Subject to any disclaimer, the term of this patent is extended or adjusted under 35 U.S.C. 154(b) by 471 days.

(21) Appl. No.: 12/845,570

(22) Filed: Jul. 28, 2010

(65) Prior Publication Data

US 2012/0025714 A1    Feb. 2, 2012

(51) Int. Cl.
*H01J 13/46*    (2006.01)

(52) U.S. Cl.
USPC ............... 315/32; 315/33; 359/237; 359/642

(58) Field of Classification Search
USPC ............... 359/290, 291, 292, 294, 295, 298, 359/301, 302, 303, 304, 307, 308, 318, 319, 359/321, 333, 342, 343, 344, 346, 347, 642, 359/831, 833, 894, 900, 487.04, 489.08, 359/629–640, 483.01; 385/7; 372/7
See application file for complete search history.

(56) References Cited

U.S. PATENT DOCUMENTS

| | | | |
|---|---|---|---|
| 4,492,436 A | 1/1985 | Bergmann | 350/395 |
| 4,841,157 A | 6/1989 | Downing, Jr. | 250/574 |
| 4,887,900 A | 12/1989 | Hall | 356/350 |
| 4,982,139 A | 1/1991 | Amir et al. | 315/151 |
| 5,209,112 A | 5/1993 | McCoy et al. | 73/170.01 |
| 5,250,797 A | 10/1993 | Sano et al. | 250/205 |
| 5,367,399 A | 11/1994 | Kramer | 359/206 |
| 5,406,172 A | 4/1995 | Bennett | 315/112 |
| 5,515,169 A | 5/1996 | Cargill et al. | 356/417 |
| 5,657,164 A | 8/1997 | Shuman | 359/634 |
| 5,771,254 A | 6/1998 | Baldwin et al. | 372/31 |
| 5,786,937 A | 7/1998 | Chu et al. | 359/583 |
| 5,796,481 A | 8/1998 | Downing, Jr. | 356/343 |
| 5,809,050 A | 9/1998 | Baldwin et al. | 372/43 |
| 5,812,582 A | 9/1998 | Gilliland et al. | 372/50 |
| 5,812,717 A | 9/1998 | Gilliland | 385/93 |
| 5,835,514 A | 11/1998 | Yuen et al. | 372/36 |
| 5,900,975 A | 5/1999 | Sussman | 359/493 |

(Continued)

OTHER PUBLICATIONS

Grabherr et al., "Integrated photodiodes complement the VCSEL platform" Proceedings of the SPIE, 2009, 9 pages.

(Continued)

*Primary Examiner* — Douglas W Owens
*Assistant Examiner* — Jianzi Chen
(74) *Attorney, Agent, or Firm* — Seed IP Law Group PLLC

(57) ABSTRACT

A light source system and method that generates stable optical power over time and temperature for use in laser scanning, turbidity sensing, airborne-particle analysis, fog and visibility monitoring, blood-gas analysis and applications where light source output intensity changes less than one-half percent over a 50° C. range. The system includes a miniature semiconductor light emitter that can be powered by two AAA alkaline batteries for more than 100 hours and is about 1 cm$^3$ in size (TO-5 package). A semiconductor light emitter emits a beam of linearly polarized light through a coated optical element having first and second surfaces that meet at an acute angle, the first surface reflecting a portion of the light to a control system and transmitting the rest through the second surface in a direction normal to it and thereby enabling immunity to light interference in the reflected and transmitted beams and novel, error-canceling properties.

53 Claims, 20 Drawing Sheets

U.S. PATENT DOCUMENTS

| | | | |
|---|---|---|---|
| 6,049,073 A | 4/2000 | Roddy et al. | 250/205 |
| 6,128,133 A | 10/2000 | Bergmann | 359/487 |
| 6,222,202 B1 | 4/2001 | Babic et al. | 257/85 |
| 6,350,978 B1 | 2/2002 | Kasai | 250/205 |
| 6,392,215 B1 | 5/2002 | Baumgartner et al. | 250/205 |
| 6,396,858 B2 | 5/2002 | Kawakami et al. | 372/38.02 |
| 6,400,102 B1 | 6/2002 | Ghanem | 315/291 |
| 6,483,862 B1 | 11/2002 | Aronson et al. | 372/50 |
| 6,527,460 B2 | 3/2003 | Cohen et al. | 385/94 |
| 6,534,756 B1 | 3/2003 | Grimbergen | 250/205 |
| 6,586,678 B1 | 7/2003 | Rosenberg et al. | 174/52.5 |
| 6,587,471 B1 | 7/2003 | Bass et al. | 370/432 |
| 6,596,977 B2 | 7/2003 | Muthu et al. | 250/205 |
| 6,720,544 B2 | 4/2004 | Barna et al. | 250/205 |
| 6,737,635 B2 | 5/2004 | Engelhardt et al. | 250/225 |
| 6,787,748 B2 | 9/2004 | Suzuki | 250/205 |
| 7,002,733 B2 | 2/2006 | Dagenais et al. | 359/337 |
| 7,196,343 B2 | 3/2007 | Van Herpen et al. | 250/505.1 |
| 2003/0066946 A1 | 4/2003 | Grimbergen | 250/205 |
| 2003/0116695 A1 | 6/2003 | Masuda et al. | 250/205 |
| 2007/0063125 A1 | 3/2007 | Downing, Jr. | 250/205 |

OTHER PUBLICATIONS

Optek, Vertical Cavity Surface Emitting Laser in TO-46 Package, Sep. 2003, 4 pages.

Vertilas, Vertilas VCSEL Laser Diodes, Nov. 30, 2004, 4 pages.

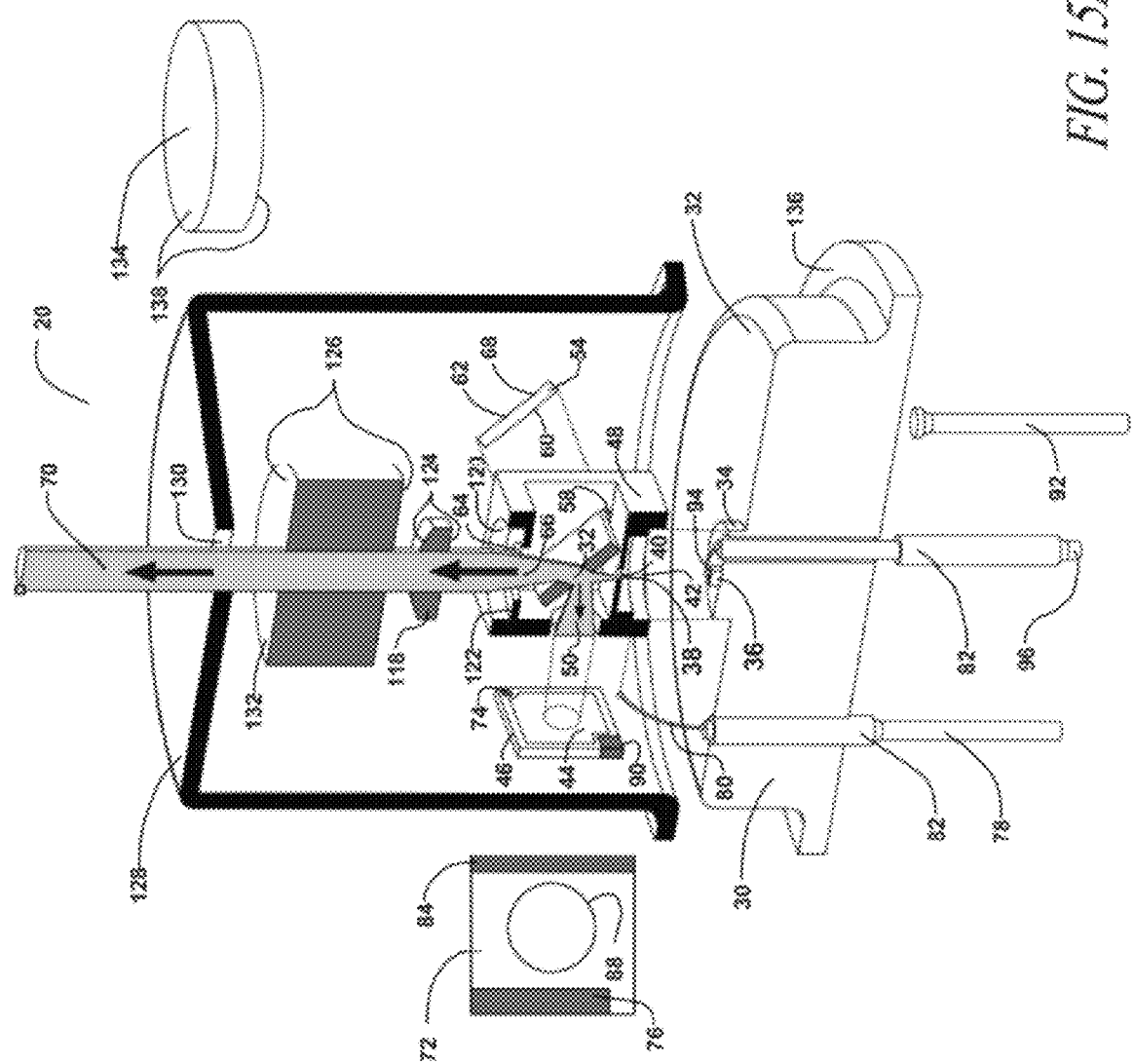

Table 1 – Summary of wavelength, polarization and control-error sensitivities for uncoated single-surface beamsplitter, assuming: $d\lambda/dT = 0.05$ nm/°C, $\beta = \pm 0.13$ deg/°C, and angle of incidence = 45°.

| Material | Index | $dn/d\lambda$ | $F_{TM}$ | $dF/(F\cdot d\lambda)$, TM | $F_{TE}$ | $dF/(F\cdot d\lambda)$, TE | $dF/(F\cdot d\phi)$ |
|---|---|---|---|---|---|---|---|
| | | 1/nm | | ppm/nm | | ppm/nm | ppm/deg |
| BK7 | 1.51 | ≈ 2.4e-5 | 110.2 | 120 | 9.54 | 65 | 52,000 |
| SF10 | 1.72 | ≈ 6.5e-6 | 48.3 | 211 | 6.02 | 120 | 41,120 |

| Material | $F_{TM}$ | $dF/(F\cdot dT)$, TM | $F_{TE}$ | $dF/(F\cdot dT)$, TE |
|---|---|---|---|---|
| | | [ppm/°C] | | [ppm/°C] |
| BK7 | 110.2 | 6 | 9.54 | 3 |
| SF10 | 48.3 | 11 | 6.02 | 6 |

Table 2 – Summary of wavelength, polarization and control-error sensitivities for HR-coated single-surface beamsplitter, assuming: $d\lambda/dT = 0.05$ nm/°C and $\beta = \pm 0.13$ deg/°C.

| $\lambda$ | $F_{TM}$ | $dF/(F\cdot d\lambda)$, TM | $dF/(F\cdot dT)$, TM | $F_{TE}$ | $dF/(F\cdot d\lambda)$, TE | $dF/(F\cdot dT)$, TE | $dF/(F\cdot d\phi)$ Max. |
|---|---|---|---|---|---|---|---|
| nm | | ppm/nm | ppm/°C | | ppm/nm | ppm/°C | ppm/deg |
| 669.0 | 9.54 | +1810 | 90.4 | 9.74 | −5640 | −280 | −363 |
| 671.5 | 9.58 | +1640 | 81.9 | 9.58 | −7170 | −360 | 0 |
| 674.0 | 9.62 | +1470 | 73.6 | 9.40 | −8780 | −440 | +348 |

Table 3 - HR coating

| Layer number | Physical Thickness (nm) | Optical Thickness | Refractive index ($\lambda$ = 670 nm) | Material |
|---|---|---|---|---|
| 1 | 155.0 | 0.337 | 1.4585 | $SiO_2$ |
| 2 | 54.3 | 0.168 | 2.0791 | $Ta_2O_5$ |
| 3 | 136.7 | 0.297 | 1.4585 | $SiO_2$ |
| 4 | 117.4 | 0.364 | 2.0791 | $Ta_2O_5$ |
| 5 | 50.1 | 0.109 | 1.4585 | $SiO_2$ |
| 6 | 14.7 | 0.046 | 2.0791 | $Ta_2O_5$ |
| 7 | 3.7 | 0.030 | 1.4585 | $SiO_2$ |
| Substrate | | | 1.4568 | Fused Silica |

Total thickness 541.9 nm

FIG. 17

HIGH-STABILITY LIGHT SOURCE SYSTEM AND METHOD OF MANUFACTURING

BACKGROUND

1. Technical Field

The present disclosure pertains to the generation of light and, more particularly, to a light source system that generates stable optical power over time and temperature.

2. Description of the Related Art

Constant-intensity light sources are commonly used in industrial applications where the light intensity has to remain unchanged under varying ambient conditions, such as temperature, pressure, and humidity. Since the optical and electrical properties of all light-emitting semiconductors and optical materials vary with temperature and other ambient conditions, an absolutely stable light source does not exist. Instead, conventional sources of varying stability are developed for specific applications.

Attributes of light sources that are critical for specific applications may include wavelength, line width, stability, power consumption, size and cost. When size and cost are the primary concerns, semiconductor lasers and light-emitting diodes are the semiconductor light emitters of choice, and if simple beam-forming measures are required to confine the output light into a group of parallel rays, vertical-cavity surface-emitting lasers (VCSELs) and surface-emitting resonant-cavity light-emitting diodes (RCLEDs) are particularly well suited for many applications because they have chip sizes smaller than 0.1 mm$^2$ and emit round conical beams of visible (RCLEDs and VCSELs) and near-infrared light (VCSELs). Furthermore, micro-lenses and reflectors are commercially available and in some cases can be integrated directly with RCLEDs and VCSELs. Producing stable light intensity when temperature changes during operation, however, places challenging demands on the design and generally increases the size and the cost of a device. For this reason, light-source designers usually must sacrifice high stability for small size to create light sources for a particular application.

Optical sources used in fiber-optic communication systems and optical sensing typically require optical power levels that can vary by as much as 15% over 50° C. This level of control can be achieved using a sensor placed close to the semiconductor light emitter to measure its temperature and an electronic circuit that varies the drive current through a semiconductor light emitter to maintain nearly constant output light intensity. For example, see U.S. Pat. No. 4,841,157. The main reason why this type of output control yields inadequate light source stability for many applications is that the output intensities of semiconductor light emitters typically used for this purpose decline with time at unpredictable and uncontrollable rates.

In another conventional system, a fraction of the light emitted by the semiconductor light emitter is compared to a preset signal, and the light-emitter drive current is continuously adjusted electronically to bring the output intensity to a desired value. This approach is common in nearly all fiber-optic modules and light sources in conventional sensing applications and results in light-intensity fluctuations less than 5% over 50° C. Examples of such designs are found in U.S. Pat. Nos. 5,209,112; 5,796,481; 6,222,202; and 6,483,862. While photodetectors have been integrated within VCSEL chips as described by Grabherr et al. 2009 (Grabherr, M., R., Phillip Gerlach, Roger King and Roland Jäger. 2009. Integrated photodiodes complement the VCSEL platform. Proceedings of SPIE Vol. 7609-03.), the control accuracy of these detectors in the aforementioned systems is and will continue to be unsatisfactory for the present disclosed system.

A light-measurement system having elements, detectors, and algorithms to determine the wavelength of incoherent, unpolarized light is described in U.S. Pat. No. 5,515,169 (Cargill et al.). Although the polarization properties of the analyzed light and the management thereof are unimportant in that system, the sensitivity of the linear wavelength filter to angle of incidence and polarization is problematic in the present disclosure and precludes use of the prior methods. In related technology, U.S. Pat. No. 6,128,133 (Bergmann) describes a BK7 glass plate beamsplitter with first and second surfaces with optical coatings that reflect orthogonal polarizations that do not interfere with one another. The inventors further disclose in FIGS. 3A and 3B the extinction ratio of the coatings to be on the order of 30 dB (1000:1). The extinction ratio of a beamsplitter equals the maximum transmittance divided by the minimum transmittance.

A system that requires a ratio greater than 40 dB (10,000:1 with coating that splits and focuses an input beam onto two spatially separated spots is found in U.S. Pat. No. 5,657,164 (Shuman) for use in optical disc reading and writing with a semiconductor chip with integrated light emitter and detector. Moreover, the nonparallelism of the first and second plate surfaces can be as much as 2° of arc, and the coatings are sensitive to angle of incidence. The angle of incidence is defined as the angle between the direction of the incident light beam and the direction normal to the surface upon which the beam is incident. Both characteristics make the prior approaches useless wherein the second surface is made substantially transparent by normal incidence and the use of an AR coating, neither of which are disclosed in U.S. Pat. No. 6,128,133.

Certain applications, including but not limited to laser scanning, water- and air-turbidity sensing, airborne-particle analysis, fog and visibility monitoring and blood-gas analysis require light sources with output intensities that change less ½% over a 50° C. range for various absorption, transmittance and light-scattering measurements would significantly benefit from miniature highly stable light sources. A miniature light source is defined as a light source that can be driven from two AA alkaline batteries and is about the size of an ordinary marble (roughly 1 cm$^3$, or a JEDEC TO-5 package). These requirements exclude the implementation of thermoelectric coolers to maintain the temperature and wavelength at pre-set values because they consume a large amount of power. Presently there is no such product on the market, while clearly there is a need in the industry for such a miniature light source that remains stable under ambient temperature variation.

BRIEF SUMMARY

The present disclosure provides for a light source system and method of making. In accordance with one aspect of the present disclosure, a device is provided that includes a semiconductor light emitter structured or operatively configured to emit a light beam of linearly polarized light having a beam polarization direction; an optical element, ideally a beamsplitter, comprising a first optical surface and a second optical surface, the second optical surface being substantially parallel to the first optical surface, the first optical surface operatively configured to reflect a first portion of the light beam and to transmit a second portion of the light beam there through, the light beam and a normal to the first optical surface defining a plane of incidence, wherein the beam polarization direction closes an acute angle with the plane of incidence; and a lens positioned to collimate the second portion of light.

In accordance with another aspect of the present disclosure, a light source is provided that includes a semiconductor light emitter structured or operatively configured to emit a light beam having a peak emission wavelength in the wavelength band; an optical element, such as a beamsplitter, with a first surface reflecting a first portion of the light beam and transmitting a second portion of the light beam, the beamsplitter comprising at least one optical coating disposed on a first optical surface of the beamsplitter, the first optical surface having a plane of incidence, the coating characterized with parameters $F_{TE}$ and $F_{TM}$ given for a range of angles of incidence and for wavelengths $\lambda$ within the wavelength band, $F_{TE}$ is defined as the ratio of power transmittance and power reflectance for light waves with polarization perpendicular to the plane of incidence, and $F_{TM}$ is defined as the ratio of power transmittance and power reflectance for light waves with polarization parallel to the plane of incidence, the light beam incident on the coating at an angle of incidence within the range of angles of incidence, wherein the parameters $F_{TE}$ and $F_{TM}$ exhibit the following property: either ($dF_{TE}/d\lambda > 0$ and $dF_{TM}/d\lambda < 0$) or ($dF_{TE}/d\lambda < 0$ and $dF_{TM}/d\lambda > 0$).

In accordance with a further aspect of the present disclosure, a device is provided that includes a semiconductor light emitter structured or operatively configured to emit a light beam of linearly polarized light; a photodetector; a beamsplitter consisting of a first optical surface and a second optical surface that meet at an acute angle, the first optical surface of the beamsplitter operatively configured to reflect a first portion of the light beam and to transmit a second portion of the light beam through the first and the second optical surfaces, the second portion of the light beam having a direction; wherein the direction is substantially normal to the second optical surface.

In accordance with still yet another aspect of the present disclosure, a method for minimizing temperature sensitivity of a light output from a light source is provided. The method includes the steps of providing an operating-temperature range; providing a range of angles of incidence; providing a semiconductor light emitter operatively configured to emit a beam of linearly polarized light having an emission wavelength, and a beam polarization direction, the emission wavelength having a characteristic variation $\lambda(T)$ with temperature T over the operating-temperature range, and the beam polarization direction having a characteristic variation $\phi(T)$ with temperature over the operating-temperature range; defining a wavelength band to include at least all emission wavelengths measured over the operating-temperature range; providing a photodetector having a responsivity, the responsivity having a characteristic variation $S(\lambda,T)$ with wavelength $\lambda$ of incident light for all wavelengths in the wavelength band and with temperature T over the operating-temperature range; providing an optical element comprising a first optical surface having a parameter $F_{TE}$ and a parameter $F_{TM}$ specified for the wavelength band and for the range of angles of incidence, parameter $F_{TE}$ defined as the ratio of power transmittance and power reflectance for light waves with polarization perpendicular to a plane of incidence of the first surface, and parameter $F_{TM}$ defined as the ratio of power transmittance and power reflectance for light waves with polarization parallel to the plane of incidence; defining a light source characteristic that includes $\lambda(T)$, $\phi(T)$, $S(\lambda,T)$ a divergence angle, and a variation in divergence angle with temperature; assembling the light source so that the semiconductor light emitter is operatively configured to emit a light beam, the light beam incident on the first optical surface, the first optical surface reflecting a first portion of the light beam and transmitting a second portion of the light beam; determining a polarization angle between the plane of incidence of the first surface and the beam polarization direction using the light source characteristic and the parameters $F_{TE}$ and $F_{TM}$, for which variation in intensity of the second portion of light beam over the operating-temperature range and over angles within the range of angles of incidence is at a minimum; and rotating the semiconductor light emitter around its optical axis to obtain the polarization angle.

In accordance with yet another aspect of the present disclosure, a method is disclosed for minimizing temperature sensitivity of a light output from a light source. The method includes the steps of providing an operating-temperature range; providing a range of angles of incidence; providing a semiconductor light emitter operatively configured to emit a beam of unpolarized light having an emission wavelength, the emission wavelength having a characteristic variation $\lambda(T)$ with temperature T over the operating-temperature range; defining a wavelength band to include at least all emission wavelengths measured over the operating-temperature range; providing a photodetector having a responsivity, the responsivity having a characteristic variation $S(\lambda,T)$ with wavelength $\lambda$ of incident light for all wavelengths in the wavelength band and with temperature T over the operating-temperature range; defining a light source characteristic that includes $\lambda(T)$, $S(\lambda,T)$, a divergence angle, and a variation in divergence angle with temperature; providing a beamsplitter comprising a first optical surface and a second optical surface that are substantially parallel; assembling the light source so that the semiconductor light emitter is operatively configured to emit a light beam, the light beam to be incident on the first surface of the beamsplitter, the beamsplitter reflecting a first portion of the light beam and transmitting a second portion of the light beam; providing an optical coating disposed on the first optical surface with parameters $F_{TE}$ and $F_{TM}$ specified for the wavelength band and for the range of angles of incidence, parameter $F_{TE}$ defined as the ratio of power transmittance and power reflectance for light waves with polarization perpendicular to a plane of incidence of the first surface, and parameter $F_{TM}$ defined as the ratio of power transmittance and power reflectance for light waves with polarization parallel to the plane of incidence, the parameters $F_{UP} = \sqrt{F_{TE}^2 + F_{TM}^2}$ and H exhibit the following property:
either ($dF_{UP}/d\lambda > 0$ and $dH/d\lambda < 0$) or ($dF_{UP}/d\lambda < 0$ and $dH/d\lambda > 0$); and
determining the values of the parameters $F_{TE}$ and $F_{TM}$ using the light source characteristic for which the variation in intensity of the second portion of light beam over the operating-temperature range and over angles within the range of angles of incidence is at a minimum.

In accordance with yet a further aspect of the present disclosure, a method is disclosed for minimizing temperature sensitivity of a light output from a light source. The method includes the steps of providing an operating-temperature range; providing a range of angles of incidence; providing a semiconductor light emitter operatively configured to emit a beam of linearly polarized light having an emission wavelength, and a beam polarization direction, the emission wavelength varying with temperature over the operating-temperature range; defining a wavelength band to include at least all emission wavelengths measured over the operating-temperature range; providing a photodetector having a responsivity, the responsivity varying with wavelength of incident light with wavelength in the wavelength band and with temperature over the operating-temperature range; providing a beamsplitter comprising a first optical surface having a parameter $F_{TE}$ and a parameter $F_{TM}$ specified for the wavelength band and for the range of angles of incidence, parameter $F_{TE}$ defined as the ratio of power transmittance and power reflectance for light waves with polarization perpendicular to a plane of incidence of the first optical surface, and parameter $F_{TM}$ defined as the ratio of power transmittance and power reflectance for light waves with polarization parallel to the plane of incidence; assembling the light source so that the semiconductor light emitter is operatively configured to emit a light beam, the light beam to be incident on the first optical surface, the first optical surface reflecting a first portion of the light beam and transmitting a second portion of the light beam; and rotating the semiconductor light emitter around its optical axis to set a polarization angle between the plane of incidence of the first surface and the beam polarization direction for which variation in intensity of the second portion of light beam over the operating-temperature range and over angles within the range of angles of incidence is at a minimum.

BRIEF DESCRIPTION OF THE SEVERAL VIEWS OF THE DRAWINGS

The foregoing and other features and advantages of the present disclosure will be more readily appreciated from the following detailed description when taken in conjunction with the following drawings, wherein:

FIG. 15A is a first embodiment of a stable light source apparatus formed in accordance with the present disclosure;

FIG. 17 contains Tables 1-3.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures or components or both associated with semiconductor light sources, including but not limited to light emitting diodes, prisms, and mirrors, have not been shown or described in order to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

The headings and Abstract of the Disclosure provided herein are for convenience only and do not interpret the scope or meaning of the embodiments.

Figure 1:
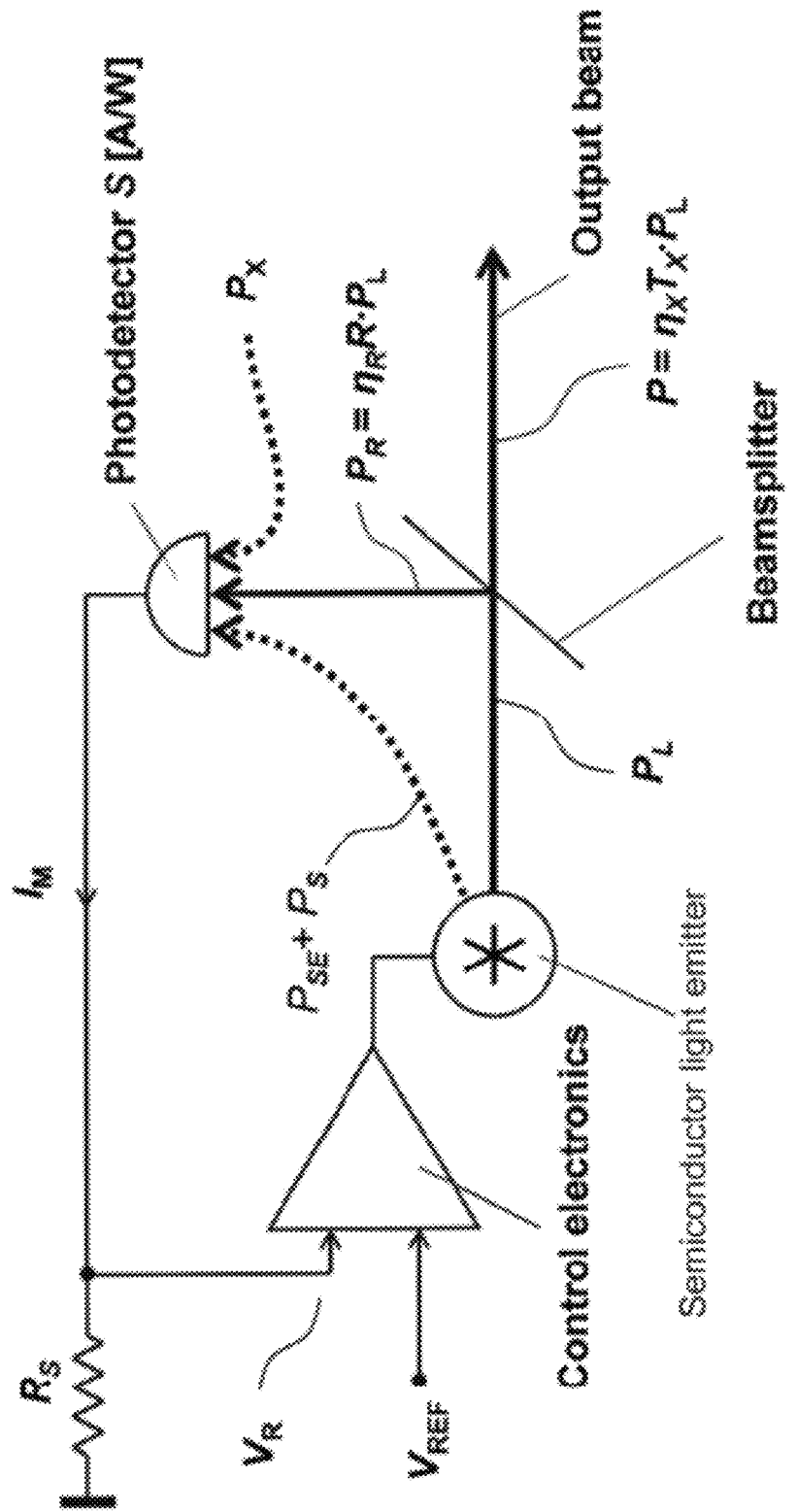
FIG. 1 is a functional block diagram of a closed-loop control apparatus for emitting light of controlled intensity formed in accordance with the present disclosure.

Light-source system: The present disclosure comprises several light-source embodiments that use closed-loop control to maintain stable optical power from a semiconductor light emitter. The relative control errors per unit of temperature for the preferred embodiments are below 100 ppm $°C.^{-1}$. A relative control error is the change in the output of a system from a preset level relative to that preset level. Control errors are expressed per unit of temperature by dividing them by the temperature range over which the change in output occurs. Using 100 ppm $°C.^{-1}$ for an example, a light source with an output of 1000 µW at 20° C., will emit 1001 µW at 30° C. A functional block diagram of a closed-loop control apparatus for emitting light of controlled intensity is illustrated in FIG. 1. It includes a semiconductor light emitter that emits a light beam of intensity $P_L$, a beamsplitter that reflects a fraction of the incident light with power reflectance R and transmits a fraction with power transmittance $T_x$, and a photodetector with conversion factor S (proportional to detector responsivity in A/W) and control electronics.

The reflected light power $P_R = \eta_R R \cdot P_L$ is coupled into the monitor photodetector with efficiency $\eta_R$. The phenomena that affect the coupling efficiency $\eta_R$ are discussed below. The light power $P_R$ is converted to electrical current $I_M = S \cdot P_R$ by the photodetector and passes through a sensing resistance $R_S$. The sensing resistance $R_S$ is used for illustration only, inasmuch as there is more than one way to generate electrical feedback in the control loop, as is known in the art. The control voltage $V_R = R_S \cdot I_M$ is compared to a pre-set reference voltage $V_{REF}$ and the difference is used by the control electronics to adjust the intensity of the light captured by the photodetector such that $V_R$ equals $V_{REF}$ and constant output power $P_{OUT}$ is ideally maintained at a preset level. The transmitted semiconductor light emitter output is referred to as the output beam, which is specified by wavelength, bandwidth, divergence angle, source-aperture size and other characteristics as required in a specific application. The output beam intensity is $P_{OUT} = \eta_X T_X \cdot P_L$, where $T_X$ is the beamsplitter transmittance and $\eta_X$ is the external coupling efficiency, which accounts for all factors that influence delivery of the output beam to its destination as discussed in later text. Systems, devices and electronic circuits that perform closed-loop control such as illustrated in FIG. 1 are well known to those of skill in the technology and will not be described herein.

Some preferred embodiments for the above-listed applications employ the functional block diagram shown in FIG. 1, but with novel optical design and manufacturing procedures. In one embodiment, the control system shown in FIG. 1 maintains a constant output intensity controlled by the $V_{REF}$ input while the semiconductor light emitter intensity and other system characteristics change with temperature, humidity, pressure, light-source aging, and other phenomena that alter the relationship between the drive current through the semiconductor light emitter and its output intensity.

The ability of a closed-loop system to maintain constant output power while the temperature changes and the semiconductor output power and beam quality degrade with time is limited by the stability of the other components in the system. In the system shown in FIG. 1, the control electronics will maintain $V_R \cong V_{REF}$ with an accuracy limited by noise and electronic component drift with temperature and the finite gain of the control loop. The difference between $V_{REF}$ and $V_R$ due to the foregoing causes is on the order of several parts per million (ppm), which is not significant in the error budget of the disclosed systems. In addition to capturing light reflected from the beamsplitter, the photodetector may also capture ambient light $P_X$, spontaneous emissions $P_{SE}$ from the sides of the semiconductor light emitter and stimulated emissions scattered from a laser beam and light from any source reflected and diffracted by structures inside the package onto the photodetector, together referred to as stray light $P_S$. Collectively, $P_{SE}$, $P_S$ and $P_X$ will cause the control system to falsely reduce the output power from its preset level, producing a control error according to equation (1).

The functional relationships of significant phenomena that can affect the output power in the proposed system are stated in equation (1).

$$P_{OUT} = \left(\frac{T_X}{R}\right) \cdot \left(\frac{\eta_X}{\eta_R}\right) \cdot \left(\frac{V_R}{SR_S} - P_{SE} - P_S - P_X\right) \quad (1)$$

A number of these phenomena change with ambient temperature as discussed below. Hereafter, the ratio $T_X/R$ is called the F ratio. When any of these phenomena change from their initial values in the operation of a light source, they can cause a control error. A brief description of phenomena that affect the sensitivity of a closed-loop control system follows.

Drift in the beamsplitter F ratio: Coated and uncoated, single-surface beamsplitters are used in the preferred embodiments. Detailed descriptions of these two types are provided below. The F ratio for a beamsplitter depends on the refractive index of the glass from which it is made and the optical properties of reflective coatings that may be applied to its surface. The wavelength, polarization state, and angle of the incident light beam also affect F. As is well known in the art, the wavelength of all semiconductor light emitters change with temperature, and for some, the polarization state does as well. The refractive index of glass depends on the wavelength of light transmitted through it and its temperature. The F ratio of an uncoated beamsplitter is strongly dependent on incidence angle and polarization state but only weakly dependent on wavelength whereas the F ratios of coated beamsplitters are very sensitive to wavelength and incidence angle but less so to changes in polarization state.

Reflection coupling coefficient ($\eta_R$): Changes in the beam profile that affect the reflection coupling are generally dependent on the shape of the beam emanating from the semiconductor light emitter and the size of the photodetector. The phenomena that affect the reflection efficiency include the size of the photodetector light-sensing area and changes of beam divergence, defined as an angular measure of the increase in beam diameter with distance from a semiconductor light emitter, growth and decay of higher-order modes and beam steering, all of which change with drive current and temperature. It is well known in the art that the emission angles of semiconductor light emitters can vary with the drive current. The ability of the beamsplitter to reflect the entire light beam onto the photodetector without loss of intensity due to diffraction, apertures and field stops has to be temperature independent so as not to introduce control errors. As expressed in equation (1), an increase in $\eta_R$ will result in diminished output power.

External coupling coefficient ($\eta_X$): Changes in the beam profile that affect the output coupling are generally the same as those described for reflection coupling efficiency and in addition the entire beam must be delivered to the output device. An increase in $\eta_X$ will result in elevated output power in accordance with equation (1).

Drift in the control voltage $V_{REF}$ may result from a drift in battery or power supply voltage. A high-quality voltage reference will drift about 10 ppm per ° C.

The photodetector responsivity (S) depends on the temperature of the detector, the wavelength of light it detects and the position within its active area where the light is captured. Photodetectors made of semiconductors such as silicon and InGaAs are polarization-selective and the polarization drift must be factored into the optimization calculations when off-normal incidence occurs in a light source. In the present disclosure, the polarization effects of the photodetector are factored into the $\eta_R$ coefficient.

The amount of spontaneous emission $P_{SE}$ coupled into the photodetector will depend on the physical construction of the system and will generally be proportional to the drive current in a semiconductor light emitter. The intensity of spontaneous emissions from the sides of a VCSEL can be as large as 80 μW per steradian and can cause control errors that are comparable in magnitude to those produced by daylight illumination of the light source. Methods to reduce the coupling of $P_{SE}$ onto the photodetector are described herein below.

The addition of scattered laser light $P_S$ to the photodetector will depend on the spatial extent of the beam, the presence of higher-order modes and the reflection coupling coefficient. It has to be minimized otherwise it will produce a control error. The sum of spontaneous emission and scattered laser light is referred to as stray light. Methods to reduce the coupling of $P_S$ onto the photodetector are described below.

Interference: The beam emitted by a semiconductor light emitter can experience interference as it is transmitted through an optical system. Interference produces unpredictable intensity fluctuations that can cause substantial control errors. As the wavelength of light from a semiconductor source varies with temperature, the intensity fluctuations caused by interference fringes can exceed 10,000 ppm/° C.

Diffraction: The spreading of a light beam beyond the geometric limits of the emitter optics is a far-field effect that can produce coupling errors in the reflected and output beams, which are factored into the $\eta_R$ and $\eta_X$ coefficients.

The external (ambient) light $P_X$ will generally depend on the physical design of a light source and the availability of external lighting, the orientation with respect to the sky and the time of day. It does not depend on temperature. External light intensity typically fluctuates with low frequency and can be rejected with optical filters and synchronous detection as is well known in the art. The daylight captured by a photodetector in devices of the preferred embodiments can produce control errors comparable to those produced by spontaneous emission $P_{SE}$ in equation (1). Methods to reduce the coupling of $P_X$ onto the photodetector are described below.

In the preferred embodiment described below, the spurious optical signals $P_{SE}$, $P_X$ and $P_S$ are minimized or eliminated by design. Under this assumption, the output power relationship (2) is simplified to $$P_{OUT} = F \cdot \left(\frac{\eta_X}{\eta_R} \cdot \frac{S_0}{S}\right) \cdot \left(\frac{V_R}{S_0 R_S}\right) \quad (2)$$

where S is the photodetector responsivity as a function of temperature and wavelength, while $S_0$ is the detector responsivity at a calibration temperature and wavelength, typically, room temperature and calibrating wavelength ($S_0$ is a constant). The product $$H(T, \lambda) = \frac{\eta_X}{\eta_R} \cdot \frac{S_0}{S} \quad (3)$$

Accounts for the temperature and wavelength variation of the coupling efficiencies and the photodetector responsivity. The output power is then clearly dependent on the product of H and F which contains all temperature (T) and wavelength dependence needed to realize a high-stability light source. The output power is then given by:

$$P_{OUT} = F(T, \lambda) \cdot H(T, \lambda) \cdot \left(\frac{V_R}{S_0 R_S}\right) \quad (4)$$

Vertical-cavity surface-emitting lasers and their characteristics: A preferred semiconductor light emitter for the disclosure is the vertical-cavity surface-emitting laser (VCSEL), but other semiconductor light emitters, such as, light-emitting diodes, super-luminescent-light-emitting diodes, resonant-cavity light-emitting diodes, and edge-emitting laser diodes may be used without departing from the spirit of the disclosure. VCSELs are categorized by their wavelength and modal properties. The emitted wavelength depends on the active material with which a VCSEL is built. All VCSELs emit a single longitudinal mode, but they can have multiple transverse modes. VCSELs that emit only one transverse mode and have a single emission wavelength are single-mode VCSELs. Multimode VCSELs emit more than one transverse mode. The presence of multiple modes that vary with drive current and temperature makes the output from multimode VCSELs complex and the polarization and beam characteristics largely unpredictable.

Single-mode VCSELs are characterized by the peak wavelength, the wavelength corresponding to the maximum intensity of emitted light, spectral width and the side-mode suppression ratio (SMSR), which is the power of the first higher mode relative to the fundamental mode expressed in deciBels (dB). While some VCSELs can have SMSR values as large as 40 dB, our experiments indicate that the preferred embodiments generally require a minimum SMSR of 10 dB. At large drive currents, single-mode VCSELs often operate in more than one mode and polarization state. They were chosen for our light source because they have the following advantageous features: (1) they are available in several spectral bands (660-680 nm, 770-790 nm, 840-860 nm and 970-990 nm); (2) narrow spectral width (<~0.3 nm); (3) low sensitivity to temperature 0.05 to 0.08 versus ~0.25 nm ° $C.^{-1}$ for Edge Emitting Laser Diodes (EELDs); (4) their polarization can be locked; (5) low threshold current (1-4 mA versus 20-40 mA for EELDs); (6) nearly circular, quasi-gaussian beams requiring simple beam-forming optics; and (7) on-wafer optical and electrical testing is feasible.

Temperature dependence of the lasing wavelength: The lasing wavelength of a VCSEL is determined by the round-trip time of a light wave in its laser cavity. It is well known that the refractive index of semiconductors and dielectrics constituting the laser cavity increase with temperature, and hence the round-trip time lengthens, resulting in an increased emission wavelength. The temperature of the cavity can be approximated by the junction temperature $T_J = \Theta_{TH} P_E + T_C$, where $\Theta_{TH}$, $P_E$, and $T_C$ are the thermal resistance, electrical power dissipated in the laser and the case temperature, respectively. The rate of change of VCSEL emission wavelength with temperature $\beta \equiv d\lambda/dT$ is about 0.05 to 0.08 nm/° C. For an operating range of 0° C. to 50° C., wavelength can therefore vary by 2.5 to 4.0 nm. Changes in the emission wavelength will affect the performance of the optical system because the refractive index of transparent dielectrics used in the optics, such as lens or beamsplitters, change with the wavelength although the effect is very small ~1 ppm ° $C.^{-1}$. As the refractive index changes with the wavelength it affects the F ratio of beamsplitters, the amount of light diffraction, and the intensity fluctuations caused by interference. Therefore, the variation in VCSEL temperature and the associated change in light wavelength ultimately limit the accuracy that can be achieved by a system with a polarization-selective loss and without temperature regulation. It also affects the F ratio of antireflection (AR) and high-reflection (HR) optical coatings used in the system.

Figure 2:
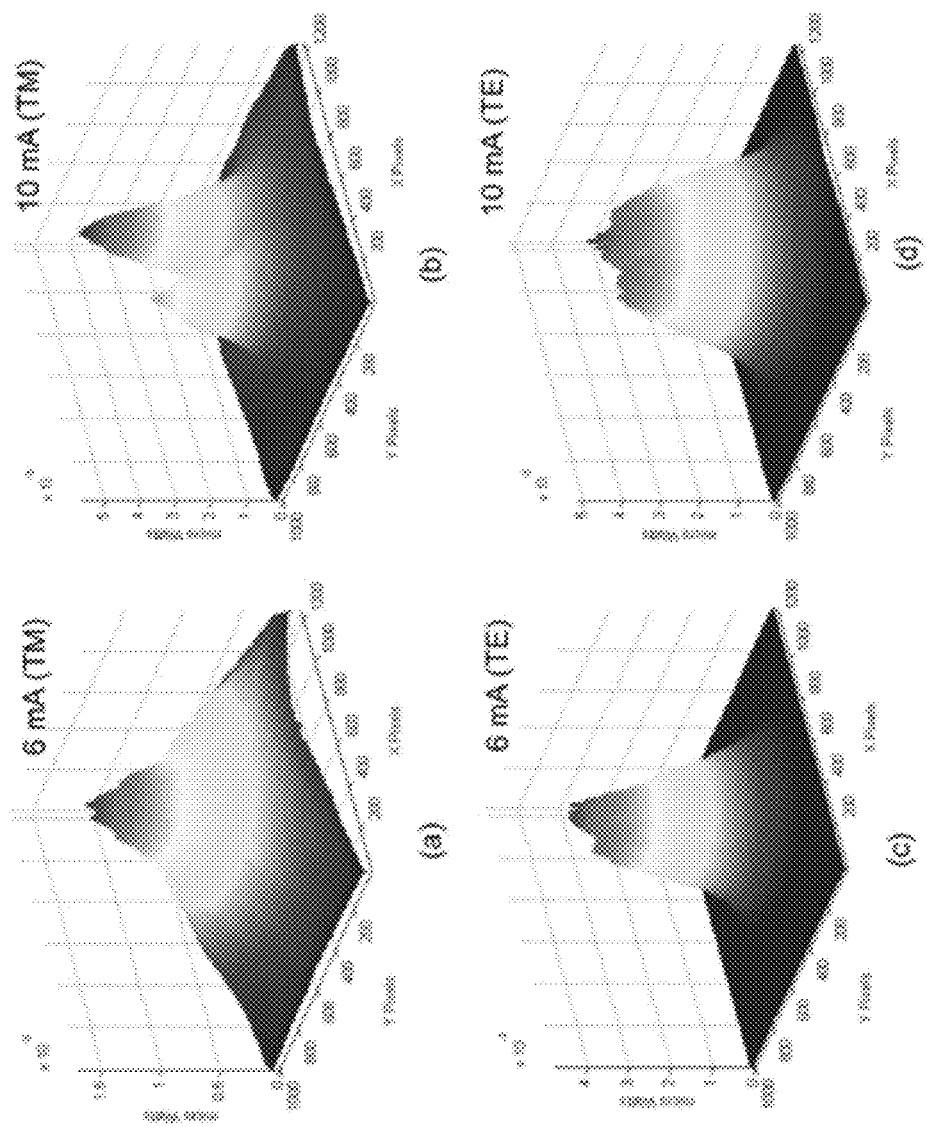
FIGS. 2A-2(D) show polarization-resolved far-field beam power profiles measured on a commercially available polarization-locked VCSEL.

Higher-Order Modes (Far-field) effects: The far-field in an optical system such as depicted in FIG. 1 is the region where the diffraction pattern of the light emitter beam does not change with distance from the source. The far field begins roughly a hundred microns from a VCSEL and extends to infinity. All optical components of the proposed embodiments are therefore in the far field. FIGS. 2A-2(D) shows far-field beam profiles for a VCSEL measured by the inventors. FIGS. 2A and 2C show the profiles at low drive current (6 mA) for two orthogonal polarizations indicated by TM and TE, respectively. FIGS. 2B and 2(D) show profiles for the same VCSEL at a drive current of 10 mA, also polarization resolved. The far-field beam profiles at the higher drive current clearly show there is more than one intensity peak in the beam, indicating that most of the power emitted from the VCSEL is arriving in a higher-order mode. When higher-order modes appear, the VCSEL beam divergence increases and the beam may spread beyond the clear aperture of the beamsplitter, the light-sensitive area of the photodetector and the clear aperture of the output optics.

In this example, part of the light intensity that would be used for control or in the output beam is therefore lost. A VCSEL that operates in one polarization at low drive current may emit light with an orthogonal polarization at higher drive currents, depending on the polarization of the higher-order mode that is being excited at higher currents. Both of these result in increased control errors in the system shown in FIG. 1. The effects are included in the coupling coefficients $\eta_R$ and $\eta_X$.

Polarization Effects: Any optical element with an F ratio that changes with the polarization of the light emitted by a light emitter can change the output power in the system depicted in FIG. 1 and produce control errors. For this reason, the polarization characteristics of a VCSEL selected for use in the preferred embodiments must be considered in the design process, carefully specified, screened during selection, and finally quantified during the manufacturing process. The screening, selection and characterization processes are explained in later text. Measurements made by the inventors show that VCSELs generally emit linearly polarized light over limited ranges of drive current and junction temperature.

As is well known in the art, the plane of incidence is the plane defined by the surface normal and the vector defining the direction of incoming radiation. It is also well known that linear polarization means there is no phase difference between the transverse electric and magnetic waves in a light beam and the plane of the electric field does not rotate with respect to the VCSEL beam axis. The degree of polarization= (Optical power in maximum polarization−Optical power in minimum polarization)/(Optical power in maximum polarization+Optical power in minimum polarization), Born and Wolf, Principles of Optics, Cambridge University Press (2002). The angle between the plane of electric-field oscillation and another plane containing the VCSEL beam axis and fixed in relation to the VCSEL chip, the plane of incidence of a beamsplitter or the transmission plane of a polarizer is called the polarization angle $\phi$. The terms polarization angle and beam polarization direction are synonymous. For screening purposes, the SMSR is a useful criterion for polarization. An SMSR ratio greater than 10 dB is a good first indication that a VCSEL emits substantially linearly polarized light.

The direction of the electric field in the light beam emitted from a VCSEL tends to align with a chip edge or a crystallographic axis. Its alignment is therefore somewhat predictable; moreover, chips have rectangular edges and the crystallographic planes of the semiconductor material are generally parallel to those edges. However, the orientation of the chip in a package is not always consistent between manufacturers and hence in general it is not possible to predict the polarization state of a packaged device. In one embodiment of the preferred method of manufacturing a high-stability light source, the VCSEL is characterized for polarization direction relative to the chip.

Figure 3A:
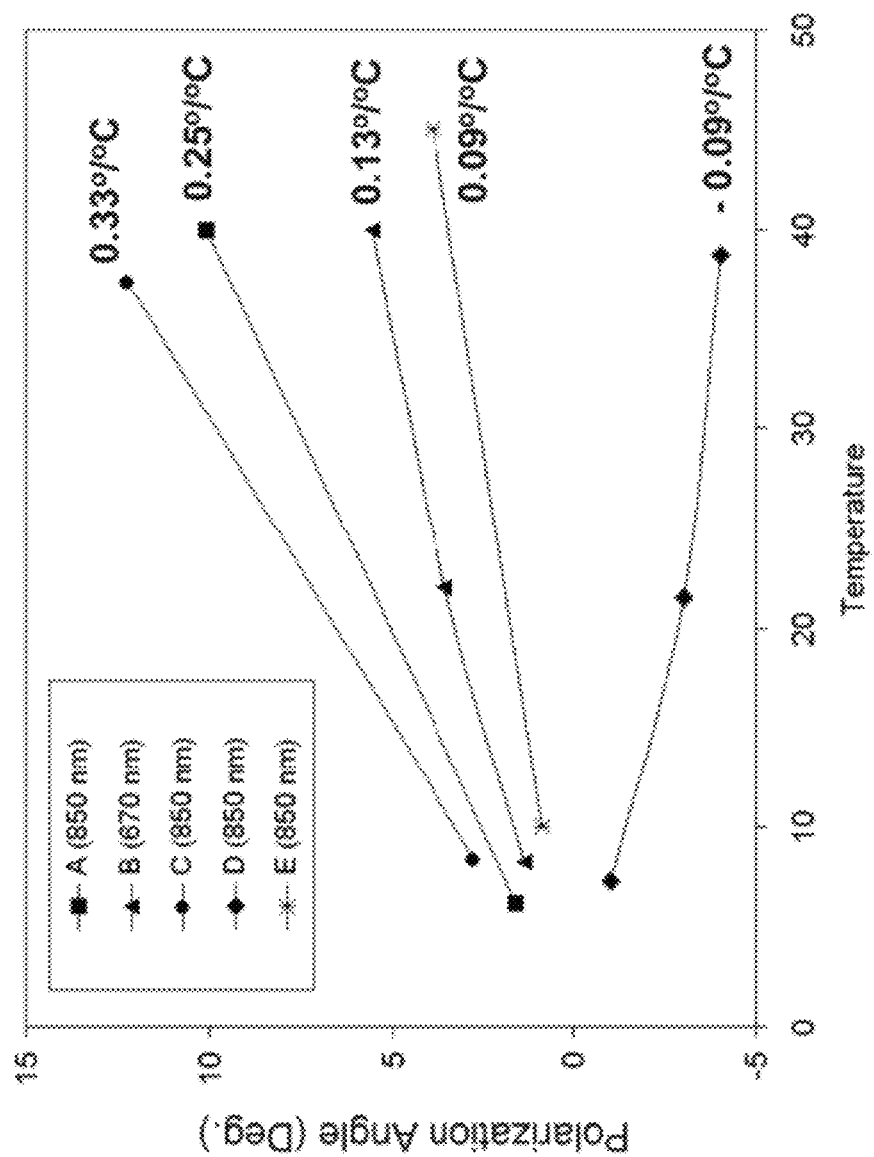
FIG. 3A is a graph of polarization angle over a temperature range.

Polarization-locked VCSELs are available commercially with SMSR>10 dB and maintain this single mode operation over a limited manufacturer-specified current range and temperature. Although the polarization of such lasers is "locked," the polarization angle varies slightly with drive current and junction temperature. FIG. 3A shows the gradual, quasi-linear drift of the polarization angles $\phi$ measured by the inventors on five polarization-locked VCSELs. Manufacturers generally do not provide information on the polarization characteristics of their VCSELs or specifications for the polarization stability such as the examples shown on FIG. 3A.

There are several ways to lock the polarization. The most often implemented methods include i) placing a diffraction grid over the top mirror of VCSELs and ii) introducing optical feedback into the laser cavity. However successful the locking methods are, they are imperfect and non-uniform current in the laser cavity and elevated temperatures can cause the active medium to favor higher modes above a threshold drive current. The VCSEL operates in more than one mode above this current, and any one of the additional higher modes can have polarization that is orthogonal to the fundamental mode and can therefore unlock the polarization. In severe cases, there can be abrupt flips between orthogonal polarization states as revealed by measurements made by the inventors and shown on FIG. 3B. In this case, polarization flips cause the output power of a closed-loop light source system to jump as much as 30% when junction temperature changes by less than one ° C. The amplitude of the polarization flip depends on the extinction ratio of the beamsplitter. In one embodiment of the method for manufacturing a high-stability light source, the VCSELs to be used in the manufacturing are screened for polarization stability to avoid use of devices that "flip" and accurate measurements of polarization characteristics are performed on the VCSELs to optimize the preferred optical system. These embodiments are explained in the following text.

Figure 3B:
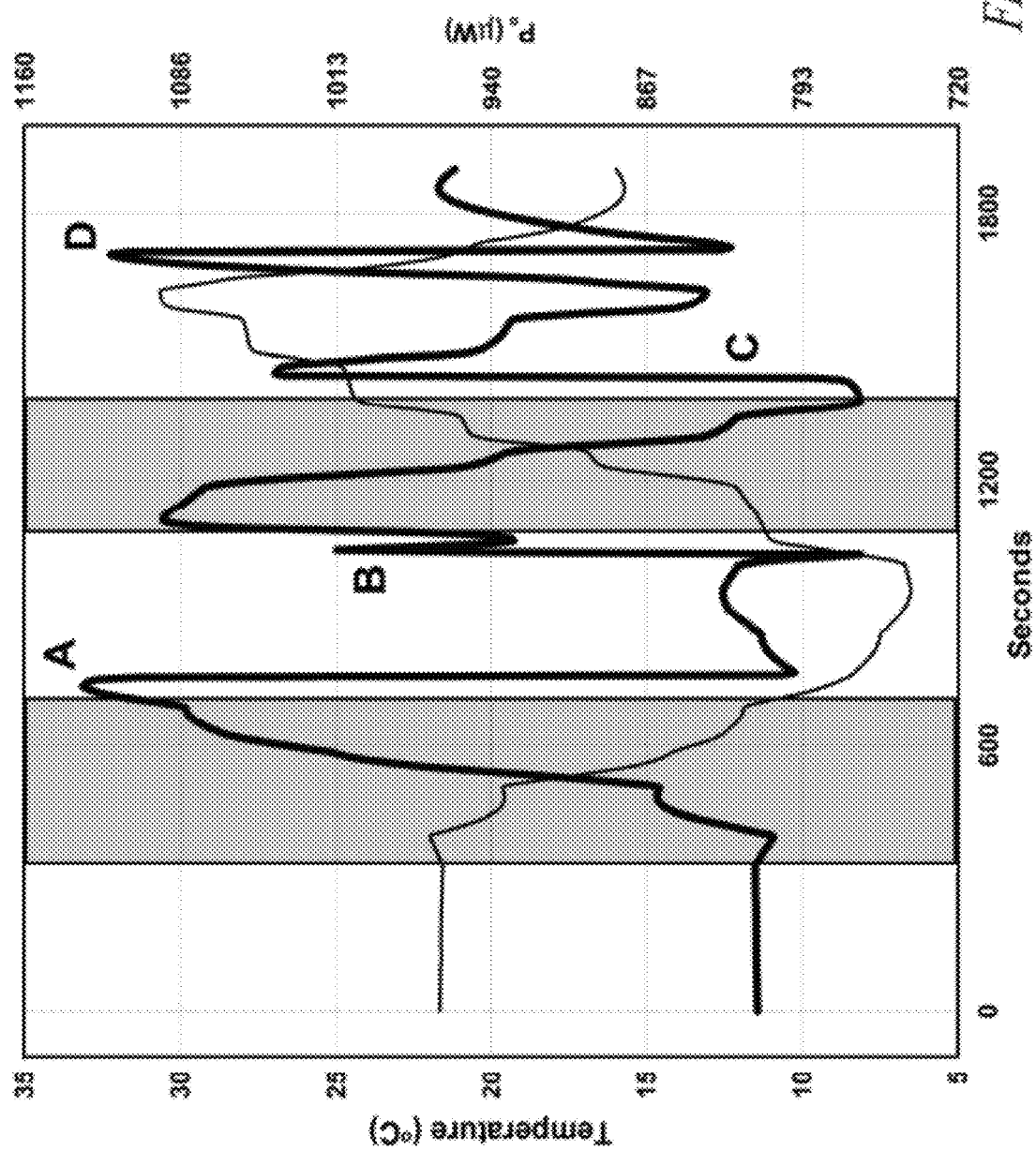
FIG. 3B is a graph of optical power emitted by a VCSEL over time with change in temperature of the VCSEL.

Measurement of VCSEL polarization angles: The conventional light-current (L-I) method used in the semiconductor laser industry for determining the polarization angle of a VCSEL involves measuring the polarization-resolved light-current characteristics where L is the intensity of light emission and I is drive current. This expeditious screening method is adequate for identifying VCSELs that "flip" as shown by FIG. 3B when drive current and temperature change over prescribed ranges and the measurement can be made on a wafer. The transmission axis of a polarizer defines the electric-field orientation of the incident light beam that gives maximum optical transmittance. Consequently, minimum transmittance occurs when the incident light beam has an electric field oriented 90° relative to the plane of incidence. A polarizer with high extinction ratio (>10,000) must be used to prevent TM-polarized light from contaminating the TE L-I curve, yielding erroneously high TE intensities and calculated $\phi$ values that are greater than actual values. Any large instability in polarization with drive current is easily detected using this method so it is satisfactory for screening purposes.

In the conventional L-I method, the VCSEL beam is passed through a polarizer and the transmitted beam intensity is measured with a polarization-insensitive photodetector. The procedure is completed at a fixed temperature. The polarizer is first adjusted to an angle $\phi_{max}$ at which maximum intensity passes to the photodetector and measurements of light intensity versus drive current are made to obtain the light-current characteristic for $\phi_{max}$. This is the TM orientation. Then the polarizer is rotated 90° to $\phi_{max}+90°$ and another light-current characteristic is measured at the TE orientation. At any drive current I the polarization angle $\phi$ of the VCSEL can be determined from the ratio of the TE and TM light intensities with the relationship: $\phi=\tan^{-1}[P(\phi_{MAX}+90°, I)/P(\phi_{MAX}, I)]^{1/2}$. When this measurement is performed at different temperatures, a complete polarization dependence on temperature and drive current for a particular VCSEL is obtained.

Figure 4:
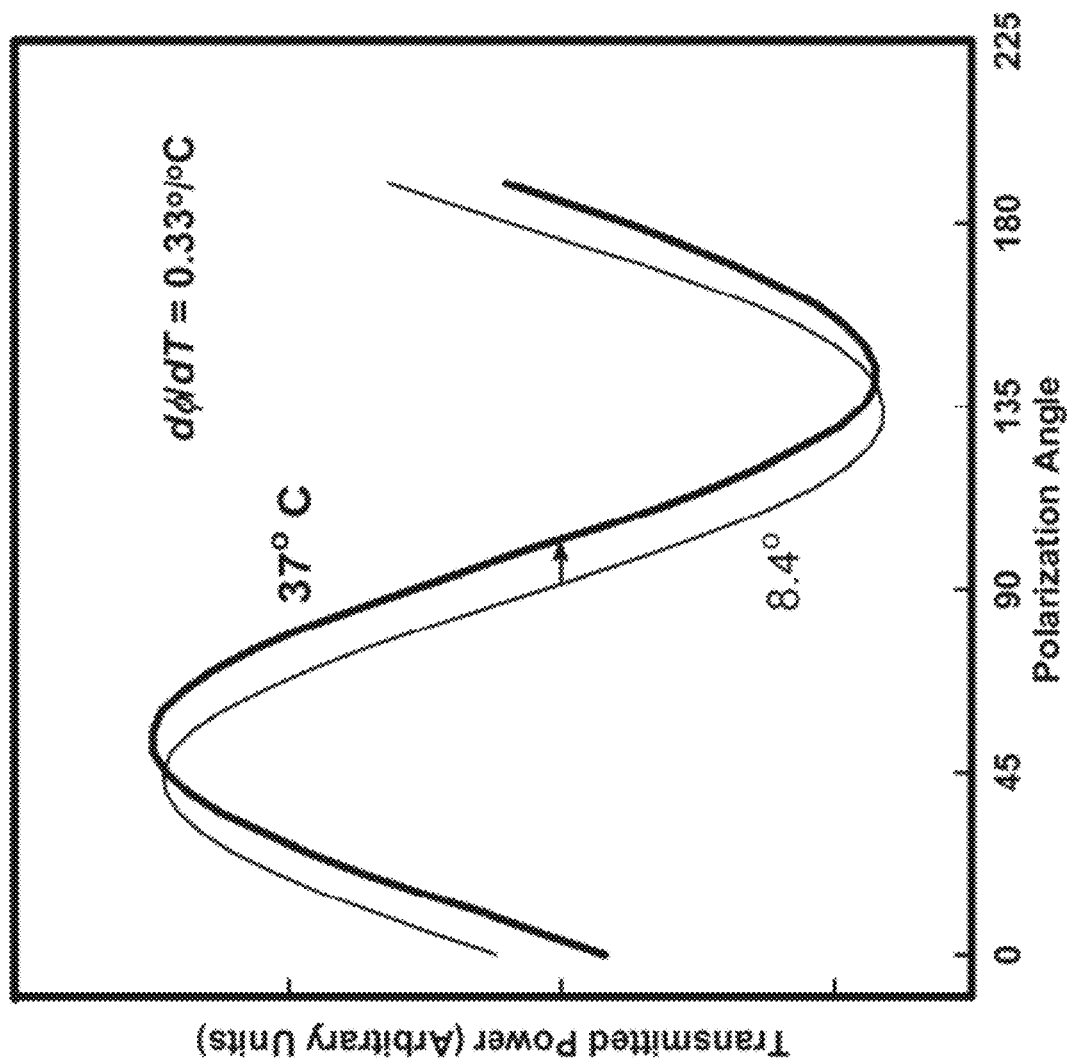
FIG. 4 shows polarization drift of a VCSEL measured by the rotating-polarizer method.

Measurement of the full polarization characteristic of a VCSEL over the range of drive currents or temperatures required by a particular application is made using the more-accurate rotating-polarizer method. Although, the rotating-polarizer method requires more characterization time than the conventional L-I method, it is significantly more accurate. The rotating-polarizer method is less sensitive to measurement error and its accuracy does not depend on the extinction ratio of the polarizer. While the rotating-polarizer method is well known in prior art, its application in the present disclosure is unique. In the rotating-polarizer method, a VCSEL is mounted in a fixed position on a temperature-controlled stage set to an initial temperature $T_0$ and the VCSEL is driven using a constant-current source set to an initial drive current $I_0$. The VCSEL output beam is passed through a polarizer and the transmitted beam intensity is measured with a polarization-insensitive photodetector. The light intensity is measured at many angles $\phi$ to determine the function $P(\phi)$, which is a sinusoidal function for a linearly polarized source. The stage is then changed to a different temperature $T_2$ and the drive current is set to maintain substantially the same maximum intensity as during the first step and the intensity function $P(\phi)$ is measured again. The $P(\phi)$ curves in FIG. 4 shows examples of the result obtained by the rotating-polarizer method for stage temperatures 8° C. (fine line) and 37° C. (bold line). The lateral offset between the curves gives the shift $\beta$ in polarization angle of the VCSEL with temperature. The same method can be used for multiple junction temperatures revealing complete drift of polarization with junction temperature. The data can be taken at constant output power, as described, or at various output powers as the polarization angle determination does not depend on the maximum output power. Multiple repetitions of the measurement taken at a large number of polarization angles can be made to increase the accuracy and precision of the method. The data shown in FIG. 3A have been taken using the rotating-polarizer method.

The essential advantages of the rotating polarizer method over the conventional L-I method are (a) the rotating polarizer method will measure polarization drift with temperature accurately even if the incident beam contains two beams of orthogonal polarization (which for a finite SMSR is usually the case), (b) the measurement of polarization drift using the rotating-polarizer method is not sensitive to the extinction ratio of the polarizer which critically affects the conventional method, and (c) in the rotating polarizer method the number of data points taken for any given temperature or current can be very large (over a full cycle of the polarization function $P(\phi)$ function) enabling high accuracy in determining minute changes in the laser polarization with drive current and temperature. The many data points taken while rotating the polarizer can be acquired automatically so that high precision can be attained. Furthermore, the slope of the $P(\phi)$ is nearly zero at the peak and minimum intensities of the transmitted beam making it difficult to determine $\phi_{MAX}$ with acceptable precision.

In one embodiment of the preferred method of manufacturing a high-stability light source, the VCSEL is characterized for polarization drift with temperature. In another embodiment, the VCSEL polarization drift with temperature is characterized using the rotating-polarizer method described above.

Surface-emitting, resonant-cavity light-emitting diodes: Another preferred light emitter in accordance with the present disclosure is the surface-emitting, resonant-cavity light-emitting diode (RCLED). This devise emits a conical, nongaussian beam of unpolarized, incoherent light through a 50-to-85-nm aperture in a planar surface in a semiconductor chip. RCLEDs are characterized by a peak wavelength and spectral width, which is typically 10 nm at the half-power level, (compared to <0.5 nm for a polarization-locked VCSEL). The beam characteristics result in greater beam divergence after collimation than is achieved with polarization-locked VCSELs, and while similar optics can be used in the construction of a stable light source, more beam divergence will occur for an RCLED than for a polarization-locked VCSEL. The consequences of beam divergence are discussed in later text. Nevertheless, the compensating properties of optical coatings can be realized, and remedies for the deleterious effects of interference are unnecessary, As described below, the calculations that support the design of an optical coating for a beamsplitter used with an unpolarized semiconductor emitter are different.

Photodetectors: The closed-loop control system of FIG. 1 relies on a temperature-stable photodetector to provide a true measure of the light intensity emitted by the semiconductor light emitter. The responsivity of a photodetector, the amount of photocurrent produced per unit of light power it captures, depends on its temperature and the wavelength of light. The control error of the preferred high-stability light source will be limited by the drift in the responsivity of the detector with wavelength and temperature. Typical silicon photodetectors such as could be used in the present disclosure have responsivities S that change with detected wavelength ($dS/Sd\lambda$) between 1,200 and 1,700 ppm/nm and ±25 ppm/° C. with temperature ($dS/SdT\lambda$). In addition to wavelength and temperature, S varies over the active area of a photodiode. The spatial variability of S can be very large, giving relative standard deviations as high as 5%. Some photodiodes exhibit variability having relative standard deviations (RSD) in the 4-to-9 $10^{-4}$ range, which is acceptably small for the preferred embodiments of a high-stability light source.

Responsivity calculated by the inventors with the above RSDs and the beam profiles shown in FIGS. 2A-2(D) demonstrated that control errors resulting from spatial variability are less than 10 ppm for a four-mA change in bias current and therefore are negligible. Two other important requirements of the photodetector are that it captures the entire light beam for the full operating ranges of temperature and bias current and that it does not have a window or protective resin coating where interference fringes can originate. This is particularly important at drive-current levels where high-order mode appearance may broaden the emission angle and make the monitor photodetector response depend on the drive current. This phenomenon increases the control errors in the system shown in FIG. 1. For this reason, high-stability photodetectors must be used.

A photodetector suitable for this application is the model S2833-1 silicon photodiode manufactured by Hamamatsu, Japan that has a responsivity temperature coefficient of 25 ppm ° $C.^{-1}$ at 650 nm, and a long-term absolute stability of ±0.2% per year. The temperature and spectral drift of S in high-quality photodiodes are nearly linear and produce a net effect that can be factored into the $\eta_R$ coefficient and included in the optimization scheme discussed in later text.

Together with the external coupling coefficient $\eta_X$, the temperature variation of H in equation (3) can be calculated as:

$$\frac{1}{H}\frac{dH}{dT} = \frac{1}{\eta_X}\frac{d\eta_X}{dT} - \frac{1}{\eta_R}\frac{d\eta_R}{dT} - \frac{1}{S}\frac{dS}{dT} \qquad (5)$$

Note that all the differentiations are to be carried out as total derivatives. By design, $d\eta_X/\eta_X dT$ and $d\eta_R/\eta_R dT$ can be made negligible to the photodetector temperature and wavelength sensitivity $dS/SdT$, hence $dH/H\ dT \approx -dS/SdT$. Using typical values for $\partial S/\partial\lambda \approx +1,500$ ppm/nm and $\partial S/\partial T = +25$ ppm/° C. (see above), in the analysis below we will assume that dH/HdT≈−1,500·β−25=−100 ppm/° C. This sensitivity can be determined accurately by measurement or from manufacturer's specifications and will be used in the design procedure described below.

Beamsplitters: The design of the beamsplitter is a critical element for achieving high stability in the preferred light source. A beamsplitter divides the beam emitted from a semiconductor light emitter into reflected and refracted beams that propagate in different directions so they do not overlap and can be used separately for control and output purposes. There are many different kinds of beamsplitters specialized for specific applications. Beamsplitters are commercially distributed by Edmunds Optics America from Barrington, N.J., USA.

There are two physical phenomena present in commercially available beamsplitters that are of particular concern for building a high-stability light source: (i) wavelength and polarization dependence of the transmitted and reflected beams, and (ii) interference fringes (etalons). Both of these phenomena are described below and mitigated using the preferred design.

Temperature dependence of optical properties: In the system shown in FIG. 1, the F ratio is the key factor determining the control error and its variation with temperature that must be minimized to achieve high stability in the output light intensity—see equation (1). The wavelength and polarization dependence of F for any beamsplitter will be determined by the refractive index, angle of incidence, optical coatings that may be present on the beamsplitter, and the interference at the photodetector and in the output beam of internal reflections generated in the beamsplitter. No matter how well designed a beamsplitter is, some wavelength and polarization dependence of the F ratio is inevitable. The inventors have found that this phenomenon (wavelength and polarization dependence) and the appearance of interference (described below) both present in commercially available beamsplitters make them unsuitable for use in the disclosure.

Far-field Effects: The numerical aperture and divergence angles of emissions increase when a semiconductor light-emitting chip warms up. As an uncollimated beam spreads, the average incidence angle and reflectance of an uncoated single-surface beamsplitter will increase, changing the F ratio and creating control errors. Calculations of F ratios made by the inventors for the VCSEL beams shown on FIGS. 2A-2(D) for example show that a 4-mA change in drive current produces changes of 245 to 1265 ppm ° C.$^{-1}$ depending on single-surface material in the TE polarization even though the beam is fully contained within the clear aperture of the beamsplitter. This control error will affect the lens-after-beamsplitter design described in later text and underscores the importance of selecting VCSELs with minimal beam divergence for this embodiment. A similar error will be produced by the change in incidence angle at the photodetector but it will be of smaller magnitude because the refractive indices of silicon and InGaAs are about twice the index of FS11 glass, giving errors in the range 90 to 245 ppm ° C.$^{-1}$.

In the case where an uncollimated VCSEL beam spreads outside the clear aperture of a beamsplitter or beyond the limits of the light-sensitive area of the photodetector, some of the light power that would be captured by the photodetector and used in the control system is lost. In such case, the control system will increase the light intensity and produce a positive control error. For this reason, the beamsplitter and the photodetector must be sufficiently large to capture the entire light beam under all the far-field conditions created by the drive current and temperature for a particular application. Measurements made by the inventors on several commercial VCSELs that have monitor photodetectors and can be used in the system shown on FIG. 1 revealed control errors ranging from 700 to 3,000 ppm ° C.$^{-1}$. Commercially available VCSELs with monitoring photodetectors are therefore generally unacceptable for use in the high-stability light source claimed herein.

Interference resonances): Interference resonances, power modulation in a transmitted beam with VCSEL frequency (wavelength), can be detected in any optical system when a beam of coherent light is split into two or more beams, which follow paths with different optical lengths to a light detector where they interfere constructively or destructively. This type of interference is reminiscent of a Fabry-Perot resonator, or etalon, whose transmittance and reflectance spectra exhibit peaks or valleys depending on whether the round trip between the reflections results in even (constructive interference) or odd (destructive interference) phase differences that are multiples of π. This interference can produce noticeable effects wherever the distance between the reflecting surfaces is smaller than the coherence length of the light transmitted through the system. Semiconductor lasers have coherence lengths between millimeters and centimeters and hence there are potentially many arrangements of reflecting surfaces in the preferred system that can produce unwanted interferences. Interference fringes can occur in beamsplitters (plates and cubes), epoxy-coated photodiodes, windows, lenses, and in free space wherever transmitted or reflected beams overlap. In the preferred embodiment, reflective surfaces are rigidly fixed with respect to one another so the intensity fluctuations from interferences are produced by the aforementioned changes in wavelength with drive current and junction temperature. The effect is greatest when the optical distance between the two overlapping reflections increases (decreases) by at least one ½π wavelengths.

The uncollimated diverging beam emitted by a VCSEL can produce circular interference fringes when incident upon the two parallel reflective surfaces of a beamsplitter made from a thin slab of glass surrounded by air. One preferred embodiment has such a beamsplitter. In order to maintain accurate control of output power with this type of beamsplitter, all of the interference fringes in the reflected and output beams must be coupled to the photodetector or to the output device such that the fluctuations in output power average to zero and do not introduce control errors.

The second important attribute of spurious reflections and the interference between them is the magnitude of the reflections and the depth of transmission modulation they can cause. A good single-layer antireflection coating may have a reflectivity below 0.1% at a specific wavelength. A Fabrey-Perot resonator formed with two such mirrors, would modulate transmitted light intensity with a depth of 0.2% or 2,000 ppm. This is unacceptably high and will severely limit the light source stability, especially because the resonances will not be well controlled.

Figure 5:
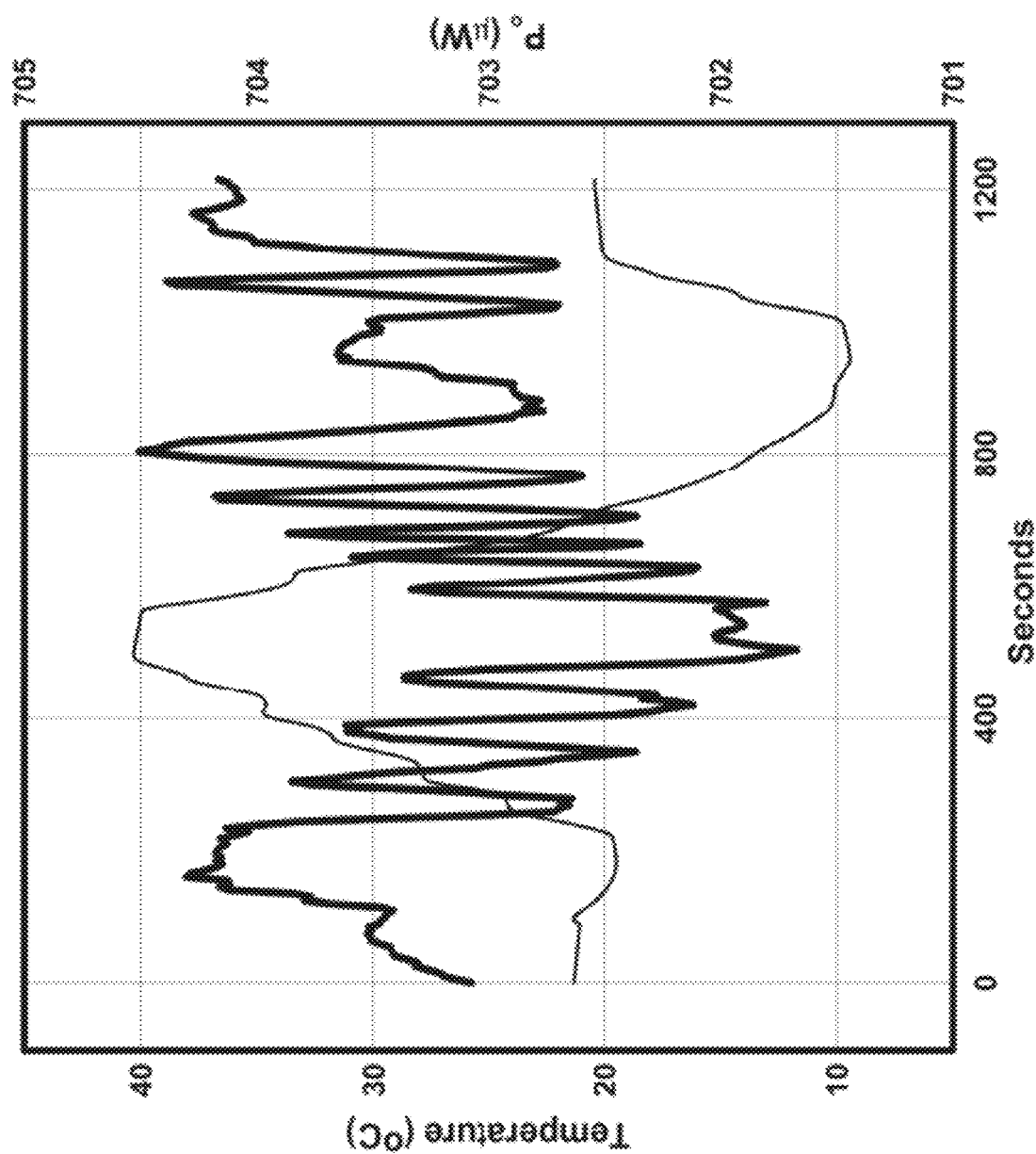
FIG. 5 is a graph of optical power showing oscillations in light source output (thick line) and device temperature (thin line)

Removing interference between multiple reflections of a collimated beam from a plate beamsplitter is impractical in the proposed system because the diameter of the incident beam is large in comparison to the thickness of beamsplitters that could be used in the system and so the reflected and transmitted beams will overlap in free space. For example, the lateral offset Δx between the beam reflected from the first surface and the beam reflected from the second surface of a 100-λm thick glass plate with n=1.5 and an incidence angle of 45° is approximately 50 μm. Maintaining collimation within a diameter several times smaller than 50 μm so as to prevent beam overlap and the intensity fluctuations caused by interference fringes is not practical for the free-space distance needed in the preferred embodiments. Interference is present on most commercially available beamsplitters, either due to epoxy or secondary surfaces. FIG. 5 shows an example of etalon resonances in an otherwise highly stable light source over a period of 1,200 seconds. As the device temperature increases and decreases (thin line on FIG. 5), the controlled VCSEL output power oscillates as the F ratio changes due to Fabry-Perot resonances (thick line). In the example shown in FIG. 5, the control error is unacceptably high, ~1,000 ppm ° C.$^{-1}$.

It is important to note that there is no interference between reflections from the first and second optically active surfaces of an optically transparent wedge having an angle α that is substantially zero when a semiconductor emitter of unpolarized, incoherent light, such as an RCLED is used to fabricate a stable light source.

It is the objective of this disclosure to achieve outstanding light source stability by optimizing the beamsplitter design and adjusting its free parameters based on the performance of the light source and the net change of photodetector S with wavelength and temperature. Wavelength, polarization drift, incidence angle of the light beam and the appearance of interference are the main phenomena that have to be managed in modifying a beamsplitter for the present purpose. The temperature dependence of other optical properties of the beamsplitter is generally significantly smaller.

Single-surface beamsplitter: A number of embodiments in which interference is eliminated or significantly reduced by the use of an optically transparent wedge are disclosed. In one embodiment of the disclosure, the beamsplitter is an optically transparent wedge prism, made of a dielectric material with the specular reflection and transmission at the first surface used to split the beam from a semiconductor light emitter, while the reflection from the second surface is directed away from the detector and does not interference with the reflection from the first surface.

Figure 6:
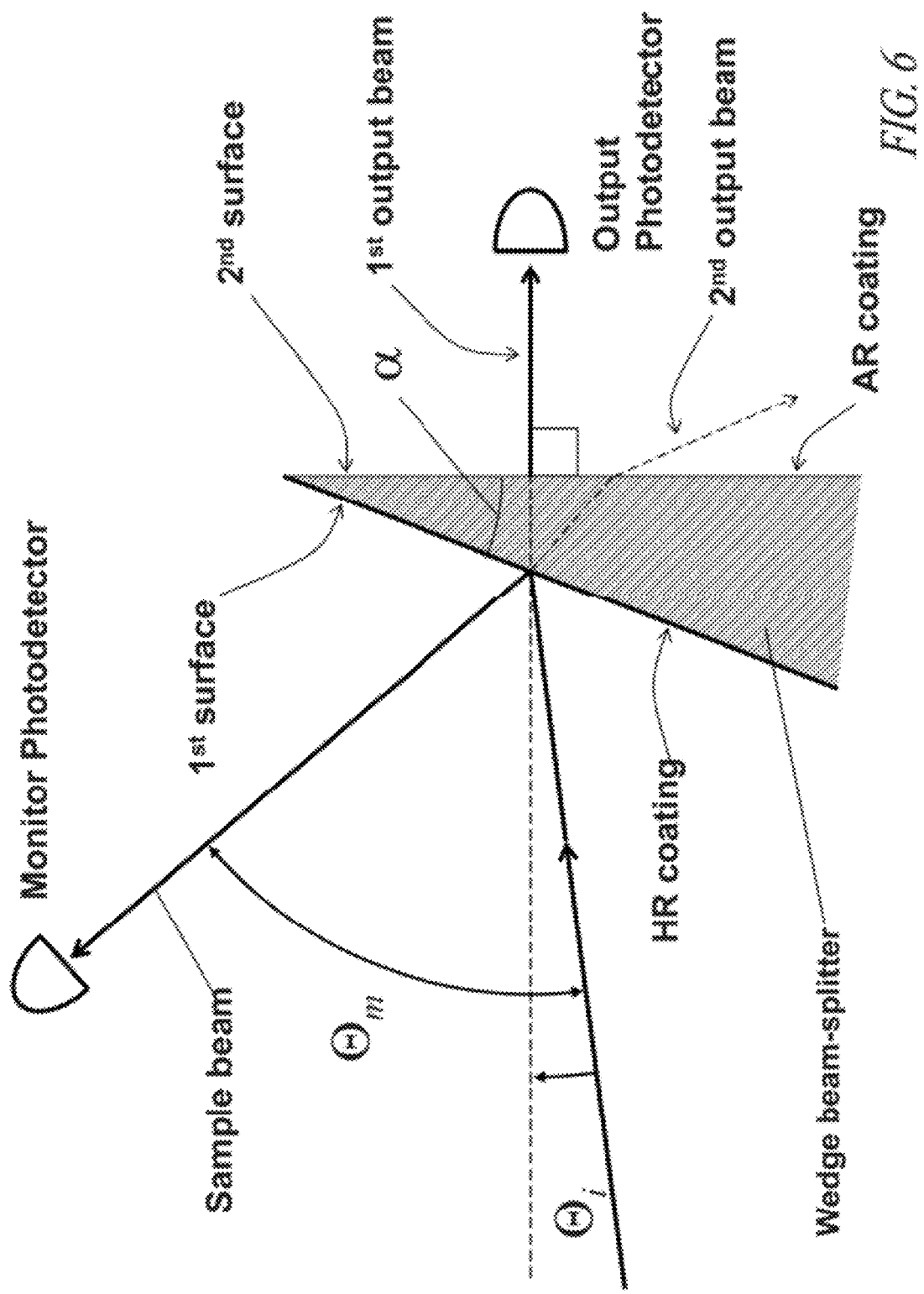
FIG. 6 illustrates an optical element in the form of an optically transparent wedge prism with angle definitions.

This embodiment is explained with the help of FIG. 6. An optically transparent wedge is made of glass with refractive index n and has a first optical surface closing an acute angle α with a second optical surface. By optical surface, we mean that a surface is used in a system to reflect or transmit light. The third surface of the wedge is not optically functional and can be implemented as more than one surface without departing from the disclosure. The incoming light beam is incident on the first surface and is reflected toward a monitor photo-detector and is simultaneously transmitted as an output beam to an output device illustrated by an output photodetector. The angle between the incident and the output beams is given by $\theta_i$, while the angle between the incident and reflected beams is denoted $\theta_m$, giving an angle of incidence $\theta_M/2$ at the first surface. In one embodiment, the primary surface has an optical coating that may be a high-reflectivity (HR) coating. In another embodiment, the second surface of the optically transparent wedge is coated with an antireflection (AR) coating that increases the transmittance of the beamsplitter and the intensity of the output beam.

In one embodiment, the first output beam is substantially normal to the second surface of the beamsplitter. In this case, the relationships between the angles $\theta_i$, $\theta_m$ and α for the preferred optically transparent wedge are given by equations 6 and 7.

$$\theta_i + \alpha = \frac{\theta_m}{2} \text{ and } \theta_m = 2\sin^{-1}(n\sin\alpha) \quad (6 \text{ and } 7)$$

Figure 7:
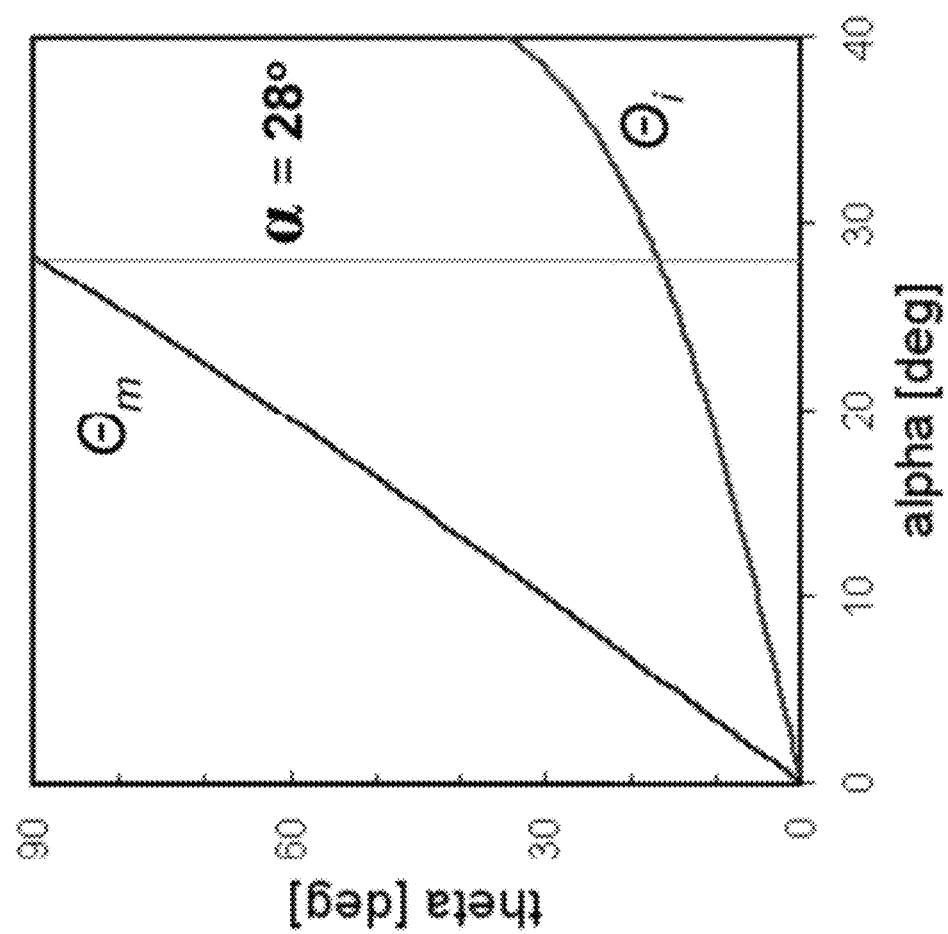
FIG. 7 shows a graph of computed angles $\theta_t$ and $\theta_m$ versus wedge angle for an optical element made of BK7 glass.

FIG. 7 shows a graph of the angles $\theta_i$ and $\theta_m$ for which the output beam is substantially perpendicular to the second surface of the optically transparent wedge (n=1.5) as an example of the application of equations (6 and 7). It shows that for the angle between the incident beam and the first reflected beams to equal 90° ($\theta_m$=90°), the wedge angle α must be about 28°. Were a high-index glass like N-LaSF9 (N=1.85) used, a wedge angle α of 22.5° would give a reflection angle $\theta_m$=90°.

The wedge angle α must exceed a critical value such that the first- and second-reflected beams do not overlap at the photodetector and therefore do not interfere at the output photodetector. This condition is relatively easy to meet: The diffraction angle of the collimated beam has to be measured or can be estimated from the emission angle of a VCSEL beam and the collimating optics. In theory, if the beam is Gaussian, the diffraction angle γ in radians would be determined by its wavelength λ and the diameter of the source beam W as γ=λ/πW, which is insignificant in the present disclosure. In practice, wedge angles (α) greater than several degrees are sufficient to prevent any interference when using collimated commercially available VCSELs.

The advantages of this preferred beamsplitter are (i) the angle α is sufficient to prevent the formation of interference fringes in the reflected beam at the photodetector and in the output beam at an output device and (ii) the transmission through the second surface (orthogonal to the output beam) has no effect on the polarization dependence of the F ratio of the wedge. The next sections explain the design of the high-stability light source addressing temperature and polarization dependence and assuming there is only one reflection from the beamsplitter.

In embodiments of the stable light source incorporating a semiconductor emitter of unpolarized, incoherent light (RCLED for instance), the angle α can be reduced to substantially zero because the reflections from the first and second optical surfaces will not interfere with one another at the photodetector. In such cases, the wedge is essentially a plate and the reflection from the second surface will be incident upon the photodetector and will contribute to the electrical current $I_M$. This contribution is minimized by the application of antireflection coating to the second surface as explained in later text.

Performance metrics: The ideal performance of any constant-power light source is unattainable with a real device. The output power $P_{OUT}$ for any given drive current or temperature will always differ from the preset level by an amount called control error. These errors will not generally be linear functions of the operating conditions (T, φ, λ, etc.). A simple and practical way to quantify control errors for the purposes of comparing the performance of different light sources is to use the relative control error in output power $P_{OUT}$ defined as:

$$D(T) = \frac{P_{OUT}(T) - P_{AVG}}{P_{AVG}} \quad (8)$$

where $P_{AVG}$ is the output power averaged over a specified temperature range. The difference between the maximum and the minimum values of D(T) is divided by the temperature range to define the relative control error per unit temperature and is expressed in ppm/° C. For example, if light-source power $P_{OUT}$ is measured at several temperatures over the interval 10° C. ($T_{min}$) to 50° C. ($T_{max}$) and minimum and maximum values of D(T) of −3000 ppm and +5000 ppm, respectively, are determined, then the relative control error per unit temperature over this temperature range is 200 ppm/° C. Output power can be replaced by other system parameters such as F, S, and the coupling coefficients $\eta_R$ and $\eta_X$ and wavelengths or polarization angles can replace temperature depending on the purpose of the comparison.

Reflection and transmission at a single air-dielectric surface: The beam of a semiconductor light emitter, a VCSEL in this example, is incident on the first surface of the optically transparent wedge (illustrated in FIG. 6) at angle $\eta_M/2$ and is inclined towards the open end of the wedge. The power reflectance R and transmittance $T_X$ of a linearly polarized beam for an interface between a transparent dielectric and air can be determined using the Fresnel equations, which are well known in the art. In transverse electric (TE) incidence of linearly polarized light, the electric field is perpendicular to the plane of incidence. In the transverse magnetic (TM) incidence, the electric field of these beams is parallel to the plane of incidence. The polarization state of a reflection from a single air-dielectric surface is the vector sum of the orthogonal TE and TM vector components of an incident beams. Since the reflectance of the TE incidence is always greater than the reflectance of the TM incidence for incidence from air the F ratio for TM incidence $F_{TM}$ is always greater than the F ratio for TE incidence $F_{TE}$. The $F_{TM}$ and $F_{TE}$ values for BK7 and SF10 glass at 45° incidence are listed in Table 1.

Polarization sensitivity of uncoated single-surface beamsplitter: The TE and TM components of a linearly polarized beam from a laser will see different F ratios at the first surface of a beamsplitter as is illustrated by the $F_{TM}$ and $F_{TE}$ values for BK7 and SF10 glasses listed in Table 1. The F ratio can be completely expressed for any polarization angle $\phi$ with the values of F at the TM and TE polarization orientations:

$$F(\phi) = \frac{2(1+F_{TM})(1+F_{TE})}{(1+F_{TE})+(1+F_{TM})-(F_{TM}-F_{TE})\cos 2\phi} - 1 \quad (9)$$

The F ratio in equation (9) gives the dependence on all optical parameters in the beamsplitter structure, including $\lambda$, $\phi$, $\theta$ and n and it works for any coated or uncoated single-surface beamsplitter. The F ratio for an uncoated, single-surface beamsplitter depends on wavelength through the refractive index dispersion. For the optical materials of interest here, this dependence is quite small as illustrated by the calculated values listed in Table 1. When wavelength is converted to temperature, the temperature coefficients of BK7 and SF10 glasses are 6 and 11 ppm/° C., respectively, for the TM polarization.

Figure 8:
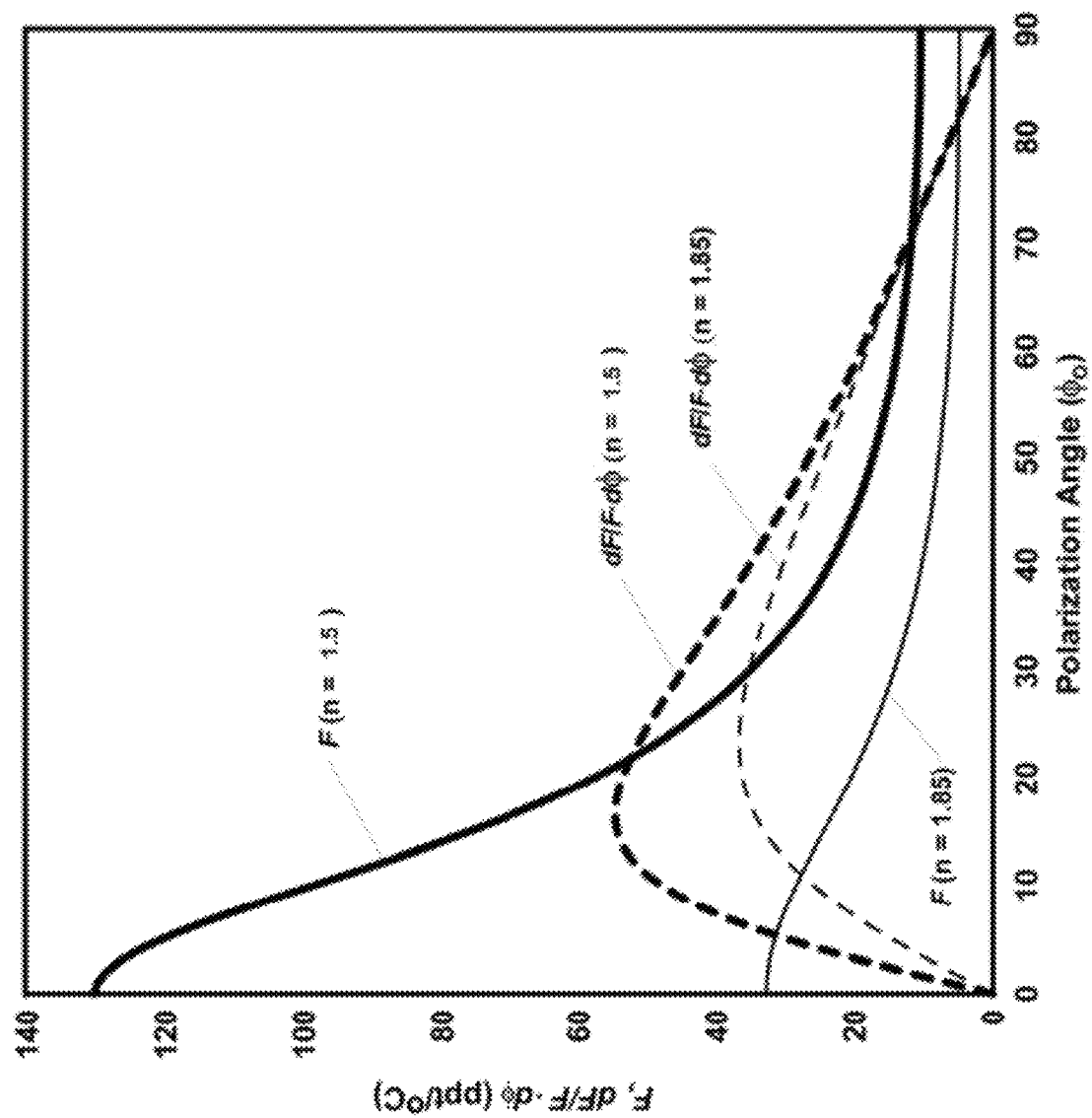
FIG. 8 is a graph of the calculated F ratio (T/R) and sensitivity for an uncoated single-surface optical element made of BK7 glass (n=1.5) and N-LaSF 9 glass (n=1.85)

The plots in FIG. 8 show F ratios versus the polarization angle $\phi$ starting from TM incidence (polarization angle $\phi=0°$) and ending with TE incidence (polarization angle $\phi=90°$) for BK7 and SF10 glasses. The F curves for BK7 and SF10 glasses are functionally the same and share the important feature of zero slopes at TE and TM incidences. This means there will be little sensitivity to small changes in $\phi$ when the semiconductor light emitter polarization is set exactly at TM or TE incidence as shown by dF/F·d$\phi$ in units ppt/° C. with the dotted traces in FIG. 8. Due to the presence of the cosine function in the denominator equation (9) is even around the TE or TM polarizations. However, it is not immediately obvious that the curvature of F around $\phi=90°$ (TE) is substantially less than it is around $\phi=0°$ (TM). In the absence of error-causing factors such as temperature drift of photodetector sensitivity and the control electronics, the light source is least sensitive to small changes in polarization arising from manufacturing tolerances and drift of the polarization angle when it is operated near the TE polarization.

In order to reduce control errors due to misalignment of semiconductor light emitter polarization and small shifts in polarization angle, it is therefore preferred to operate the light source where the curvature of the function F($\phi$) is lowest. For an uncoated single-surface beamsplitter, $F_{TM}$ can be much larger than $F_{TE}$ for air-to-dielectric reflection giving lower control signals $V_R$ and higher output power. However, it is also clear that TE incidence produces lower curvature and hence lower control errors due to changes in polarization than other possible semiconductor light emitter orientations. Output intensity is therefore traded for higher reflectance, less sensitivity to polarization angle and an improved signal-to-noise ratio because more photons are sampled in the control loop.

In designing and building a high-stability light source when only polarization drift is of significance, we therefore minimize the sensitivity of the F ratio to small changes in polarization by aligning the semiconductor light emitter electric field direction so that it is substantially perpendicular to the plane of incidence of the beamsplitter to obtain the TE polarization.

Figure 9:
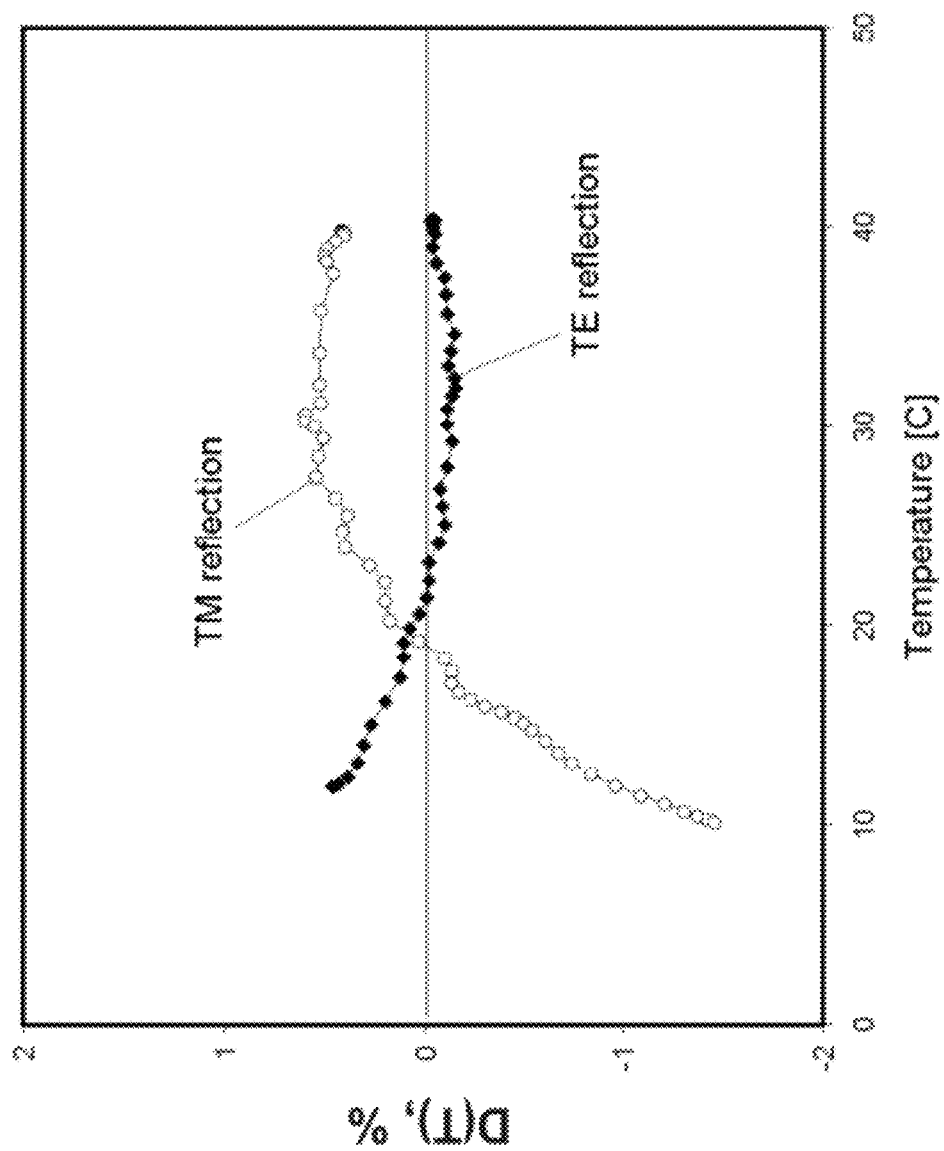
FIG. 9 is a plot of the relative error of the output power of a light source with an uncoated wedge beamsplitter.

FIG. 9 illustrates the experimental results obtained by the inventors for an exemplary uncoated single-surface optically transparent wedge in which only polarization drift produced significant control errors. FIG. 9 shows the relative error D(T) as a function of temperature measured when the incidence on the single-surface is TE and TM showing the properties of a high-stability light source utilizing a optically transparent wedge in which: i) the deviation D(T) is approximately a quadratic function near the temperature 33° where the polarization is exactly TE or TM. The TM curve has negative curvature (concave down) compared to the TE curve, which is positive (concave up) and ii) the curvature of the TE deviation is smaller than the curvature of deviations in TM orientation. Both features are consistent with the F functions at the TE ($\phi=90°$) and TM ($\phi=0°$) polarizations shown in FIG. 8. The maximum deviation for TE incidence demonstrated in FIG. 9 using the preferred system is about 0.6%, which when divided by the temperature range of the measurements yields a relative error of about 200 ppm/° C. By comparison, the relative error for the TM incidence is about 670 ppm/° C.

When factors cause control errors in addition to the optical ones previously mentioned, such as photodetector sensitivity, coupling efficiency and drift of the control electronics for instance, it is advantageous to introduce the H value defined in equation (5) in the compensation scheme. This value is determined during the fabrication process and is approximately linear with relative slope expressed in ppm per ° C. In the exemplary system, the parameters T, $\lambda$ and $\phi$ can be converted one to another with the known linear factors $\beta$ and d$\phi$/dT.

Temperature drift: Varying the temperature affects the F·H product and the resulting control errors via wavelength and polarization changes in accordance with the function:

$$\frac{1}{F \cdot H} \frac{d(F \cdot H)}{dT} \cong \left(\frac{1}{F}\frac{dF}{d\lambda} + \frac{1}{H}\frac{dH}{d\lambda}\right)\left(\frac{d\lambda}{dT}\right) + \frac{1}{F}\frac{dF}{d\phi}\left(\frac{d\phi}{dT}\right) \quad (10)$$

Here $\lambda$ is the wavelength of semiconductor light emitter emission and $\phi$ is the polarization angle as previously defined. For the purpose of illustrating the actual magnitude of effects we use the values: $\beta=0.05$ nm/° C. and $d\phi/dT=0.13$°/° C. determined by the inventors.

In order to compensate for the errors introduced by the function $H(T,\lambda)$, the initial polarization angle is set to an interval of the F curve for the particular beamsplitter material that has a relative slope substantially opposite to the function $H(T,\lambda)$. At any temperature, the electric field of a semiconductor light emitter beam can be oriented relative to the plane of incidence of a beamsplitter at an arbitrary polarization angle $\phi$ by mechanically turning it around the axis of the emitted beam. We refer to the initial adjustments of the semiconductor light emitter as the calibration temperature $T_0$ and calibration angle $\phi_0$.

For example, assuming an uncoated BK7 glass (n=1.5), single-surface beamsplitter and an $H(T,\lambda)$ curve with an average relative slope of 5000 ppm/° C., then it would be advantageous to set the calibration angle to $\phi_0=80°$ where the relative slope of the function $F(\phi)$ is about $-5000$ ppm/° C. Note that $dF/(d\phi \cdot F)$ has units ppt/° C. on FIG. 8 (ppt=parts per thousand). This is purely an example, many initial conditions and functional shapes are possible and can be accommodated by the general method and are in keeping with the spirit of the disclosure.

Coated single-surface beamsplitter: In another embodiment of the present disclosure, the single-surface beamsplitter has a polarizing coating designed for a specific band of wavelengths. The primary advantage of such a coating is that its polarizing qualities can be engineered for improved stability compared to an uncoated beamsplitter for which these qualities are fixed by the optical properties of the dielectric material. The range of wavelengths over which a coating must provide compensation for temperature effects on polarization of a semiconductor light emitter, photodetector sensitivity, coupling efficiency and other factors is called the wavelength band. It is determined by the manufacturing tolerance of the semiconductor light emitter and the wavelength shift that will occur in normal operation.

Taking VCSELs as an example semiconductor light emitter, the shortest wavelength of this range $\lambda_{min}$ will equal the minimum wavelength in a batch of VCSELs less half of the wavelength change produced by operating temperatures. The maximum wavelength $\lambda_{max}$ will equal the longest wavelength in a batch of VCSELs plus the same wavelength change. For example, the wavelengths in a batch of VCSELs might vary from 670 nm to 673 nm and the wavelengths might vary by 4 nm for a particular range of operating temperatures, giving a wavelength band of 668 nm to 675 nm ($\lambda_{max}-\lambda_{min}=7$ nm). This is purely an example and other useful wavelength bands may exist and be in keeping with the spirit of the disclosure. The coating must also function over a range of incidence angles. In one embodiment described herein this angle is substantially 45°, but other angles and ranges of angles can be used without departing from the spirit of the disclosure.

The F value of a single-surface beamsplitter with a polarizing optical coating depends on wavelength through the refractive index dispersion and the interference exhibited by the coating. The dependence of F on wavelength with an optical coating is generally much larger than the wavelength dependence of F of an uncoated dielectric, except at the crossover wavelength $\lambda_X$ (defined hereinafter below). Compare for example the entry $dF/(F \cdot d\lambda)=120$ ppm/nm for BK7 glass in Table 1 to the entry $dF/(F \cdot d\lambda)=1640$ ppm/nm for the exemplary coating at 671.5 nm in Table 2. Another important characteristic of the coating is that the slope of the F-ratio spectrum $F(\lambda)$ for the TE polarization have a sign opposite to the slope of the F-ratio spectrum for the TM polarization.

Moreover, it is advantageous to have the absolute magnitudes of these spectral slopes be approximately equal and further that the TE and TM spectra cross at one wavelength, called the crossover wavelength $\lambda_X$. The crossover wavelength is preferably near the middle of the wavelength band as this is advantageous for requiring lowest accuracy $\Delta\phi$ in setting the calibration angle $\phi_0$. However, it can be near the minimum or maximum wavelengths or even outside the wavelength band by half its width and be in keeping with the spirit of the disclosure. In mathematical terms, $F_{TE}=F_{TM}$ at $\lambda_X$ and $dF_{TM}/d\lambda \approx -dF_{TE}/d\lambda$. Yet another desirable feature of the $F_{TE}(\lambda)$ and $F_{TM}(\lambda)$ spectra is that they be substantially linear. Expressed as a ratio, the linearity of a monotonic function within a specified region equals 1.0 minus the ratio of the maximum deflection of the function from a straight line connecting its minimum and maximum values divided by its range over the region.

Figure 10:
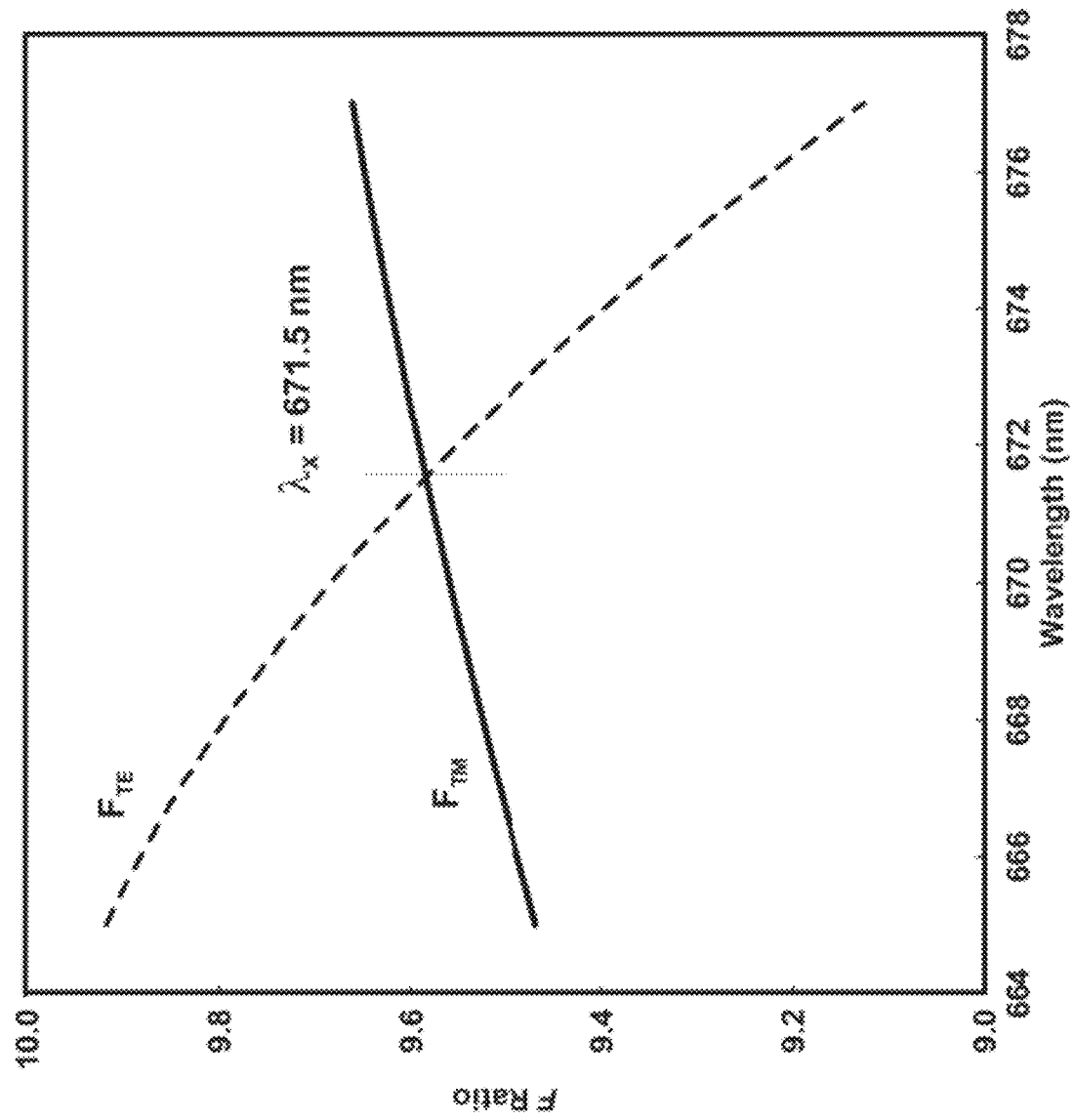
FIG. 10 is a graph of the spectral scans of the F ratio (T/R) for TM and TE polarizations of an exemplary coated single-surface beamsplitter.

The exemplary F curves in FIG. 10 have a linearity >0.85. Two independent parameters of a system that vary with temperature such as photodetector sensitivity and electronic gain can compensate for one another if their functions change with temperature with similar rates but in opposite directions. While the temperature-induced changes in the exemplary system are substantially linear, nonlinear curve shapes can be compensated by the method described herein and are in keeping with the spirit of the disclosure. Many characteristics of the F and H spectra are possible and exemplary characteristics described herein do not limit the scope of the disclosure.

We first discuss the variation of the F ratio, since the temperature dependence of F can be engineered to compensate the temperature dependence of polarization and the H value in $dH/(H \cdot dT)$ defined by equation (5) in much the same way that an uncoated single-surface beamsplitter results in a stable product of F and H when $\phi_0$ is appropriately set. FIG. 10 shows measurements of F ratios for TM and TE polarized waves incident at 45° upon an exemplary interference-coated, single-surface beamsplitter. The results are listed in Table 2 at three wavelengths (669 nm, 671.5 nm and 674 nm). Table 3 contains the stack lists for the exemplary optical and antireflection coatings referenced in the description herein.

Two important capabilities of the coating are: (i) the relative magnitude of $F_{TM}$ and $F_{TE}$ can be adjusted by design ($F_{TM}$ can be made larger, smaller, or equal to $F_{TE}$) over the wavelength band and (ii) the rate of change of $F_{TM}$ and $F_{TE}$ with wavelength, the spectral slope, can change in opposite directions. These features allow the sensitivity $dF/F \cdot d\phi$ and H values to take both positive and negative values, which makes it an adjustable parameter that is used to compensate temperature variation of the other temperature dependent parameters in the system and allows very high stability in coated single-surface beamsplitters as described below.

Figure 11:
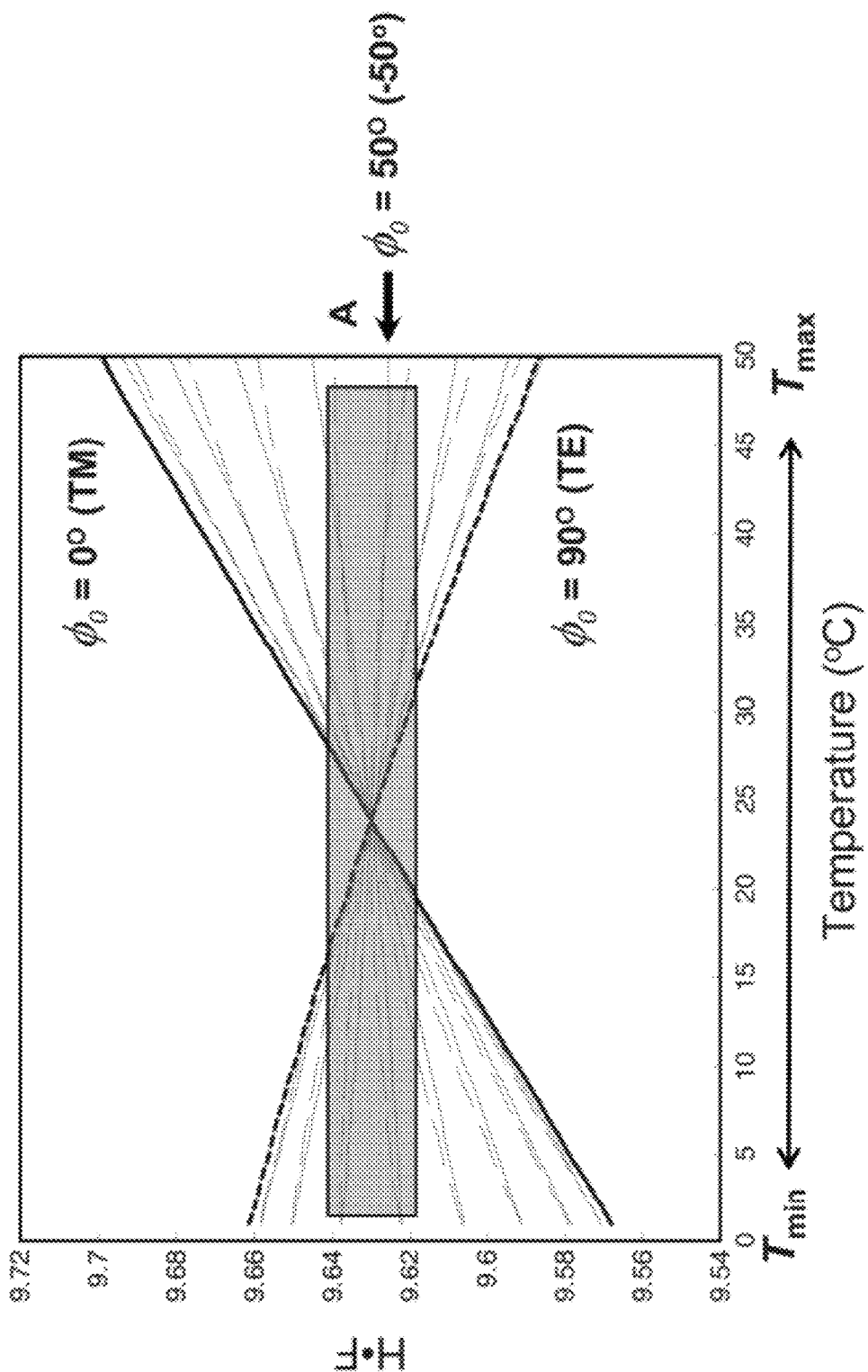
FIG. 11 is a monogram of H·F products versus temperature for various calibration polarization angles $\phi_0$, solid light curves ($\phi_0$+10, +20, etc.), and dashed light curves ($\phi_0$−10, −20, etc.)

The preferred method for realizing a high-stability light source using a coated single-surface beamsplitter is described with the help of FIG. 11. Since the semiconductor light emitter wavelength drifts with temperature approximately linearly, the F ratios are multiplied by the H values computed for specific temperatures to give the curves marked $\phi=0°$ (TM) and $\phi=90°$ (TE) in FIG. 11. The high-stability light source is expected to operate over a temperature range delimited by $T_{min}$ and $T_{max}$. The F ratio for any angle $\phi$ can be calculated exactly using equation (10) where the $F_{TE}$ and $F_{TM}$ values are determined at the given temperature and drive current from the spectral scan of the optical coating provided by the manufacturer. The F ratio is then multiplied by the H value at the corresponding temperature calculated with equation (5).

FIG. 11 shows the resulting exemplary H·F data when the calibration angle $\phi_0$ is incremented in steps of 10° from −90°

(TE), through 0° (TM) and then to +90° polarization angle. It is clear that if the starting angle $\phi_0$ is zero, it can be adjusted in both positive and negative directions, i.e., clockwise and counter clockwise rotation of the semiconductor light emitter about its beam axis. Two adjustment directions enable compensation for polarization drift in both positive and negative directions. For example, it can be seen in FIG. 11 that with $\phi_0>0$ and $\beta>0$ an increase of polarization angle will decrease the H·F product, however a negative starting polarization angle $\phi_0<0$ and positive temperature coefficient ($\beta>0$) will result increased H·F products with positive polarization drift. In this way, both polarities of polarization drift can be compensated using the preferred method.

The H·F($\phi$) curves in FIG. 11 therefore show the complete effects of semiconductor light emitter temperature and wavelength on the beamsplitter and the monitor photodetector. For any initial setting $\phi_0$, the semiconductor light emitter polarization angle may drift by an amount $(d\phi/dT)(T-T_0)$ when temperature is changed to a new value T. The new polarization angle is therefore given by $\phi(T)=\phi_0(T_0)+(d\phi/dT)(T-T_0)$. FIG. 11 shows how the H·F product changes with temperature for an exemplary value of $\beta$ and starting polarization angle $\phi_0$ set at temperature $T_0=0°$ C. The family of curves obtained by stepping the initial polarization angle and ramping temperature allows the designer to determine and numerically evaluate the optimal starting angle $\phi_0$ for the range of operating temperatures $T_{min}$ to $T_{max}$.

The optimal calibration angle is found using a chart prepared for the actual optical coating, the monitor photodetector properties and the coupling efficiencies of a particular highly stable light source and by further identifying the value of $\phi_0$ for which the product of functions H(T) and F(T) approximates a horizontal line under the least square fit of the H·F products on temperature. For the data shown in FIG. 11, this line is located near the arrow A. It is clear that a VCSEL with $d\phi/dT$ of either polarity ($\pm$) can be fitted as the calibration angle $\phi_0$ and therefore can change from positive to negative values.

Figure 12:
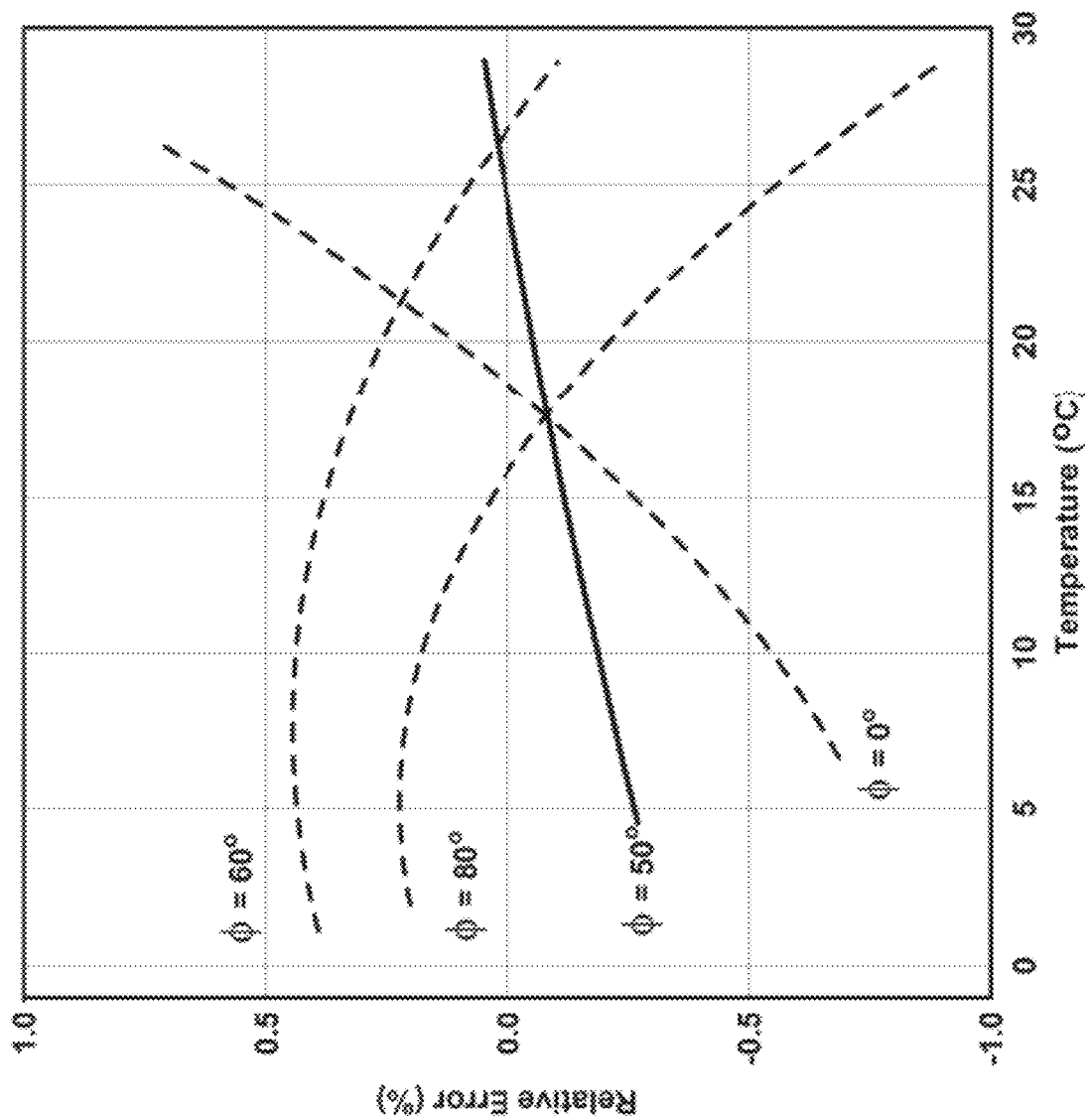
FIG. 12 illustrates relative error of the output power of a light source with a coated wedge optical element.

FIG. 12 illustrates experimental data obtained by the inventors which demonstrate that a coated single-surface wedge can be used to realize highly stable output as temperature varies. FIG. 12 shows, in much the same way as does FIG. 8, that the relative error for incidence at $\phi_0=50°$ yields a maximum value of 0.3%. Dividing this value by the temperature range of the measurements (30° C.) gives a control error of 100 ppm/° C. The angle $\phi_0=50°$ is close to the calibration angle indicated by arrow A on FIG. 11. The curves for $\phi_0=20°$ and $\phi_0=80°$ have maximum values of 1.0% and relative control errors of about 300 ppm/° C. giving substantially larger errors than are realized by using the optimization procedure.

Coated single-surface beamsplitter for unpolarized light: A variation of the high-stability light source is built with a semiconductor light emitter that emits a light beam of unpolarized light. In such a variation, a polarizing coating for a single-surface beamsplitter is designed to compensate for the function H(T,$\lambda$) using the temperature-induced variation of the function $F_{up}=(F_{TE}^2+F_{TM}^2)^{1/2}$. In order to achieve compensation, the relative slopes of $F_{UP}(T,\lambda)$ and H(T,$\lambda$) must be substantially equal in magnitudes but of opposite sign, i.e., $dF_{UP}/F_{UP}\cdot dT=-dH/H\cdot dT$. The wavelength band over which a coating must provide compensation for temperature effects on photodetector sensitivity, coupling efficiency and other factors is determined by the manufacturing tolerance of the semiconductor light emitter and the wavelength shift that will occur in normal operation.

Taking RCLEDs as an example of a semiconductor light emitter of unpolarized light, the maximum intensity of the radiated light beam occurs at the peak wavelength. The minimum wavelength $\lambda_{min}$ of the wavelength band equals the minimum peak wavelength of a batch of RCLEDs less half of the wavelength change produced by operating temperatures and the maximum wavelength $\lambda_{max}$ of the wavelength band equals the longest wavelength in a batch of VCSELs plus the same wavelength change. For example, the peak wavelengths in a batch of RCLEDs might vary from 645 nm to 655 nm and the wavelengths might vary by 3.5 nm for a particular range of operating temperatures, giving a wavelength band of 643.25 nm to 653.25 nm ($\lambda_{max}-\lambda_{min}=10$ nm). This is purely an example and other useful wavelength bands may exist and be in keeping with the spirit of the disclosure.

The coating must also function over a range of incidence angles. In one embodiment this angle is substantially 45°, but other angles and ranges of angles can be used without departing from the spirit of the disclosure. The dependence of $F_{UP}$ on wavelength for an optical coating is generally much larger than the wavelength dependence of $F_{UP}$ of an uncoated dielectric and is a tunable parameter in the coating-design process.

Figure 13:
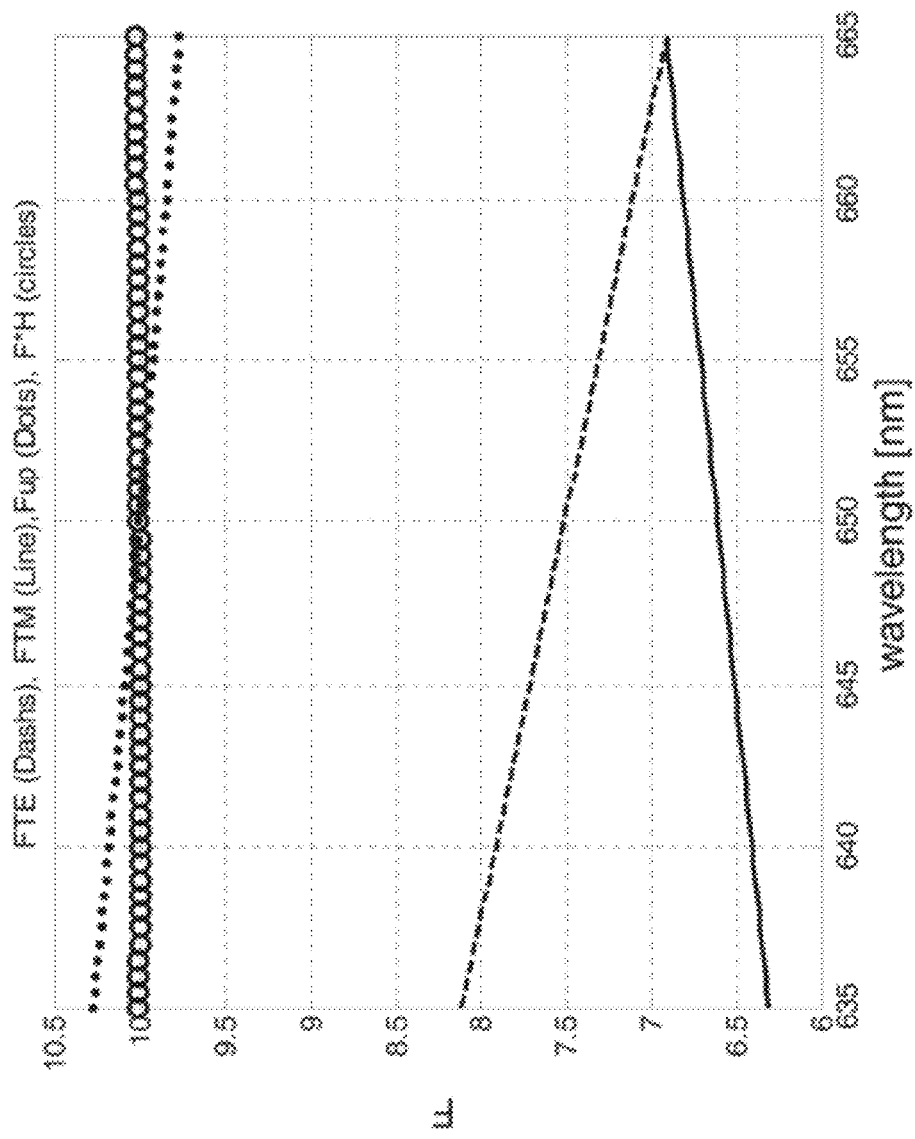
FIG. 13 is a graph of exemplary spectra for optical coating for an emitter of unpolarized light.
Figure 14:
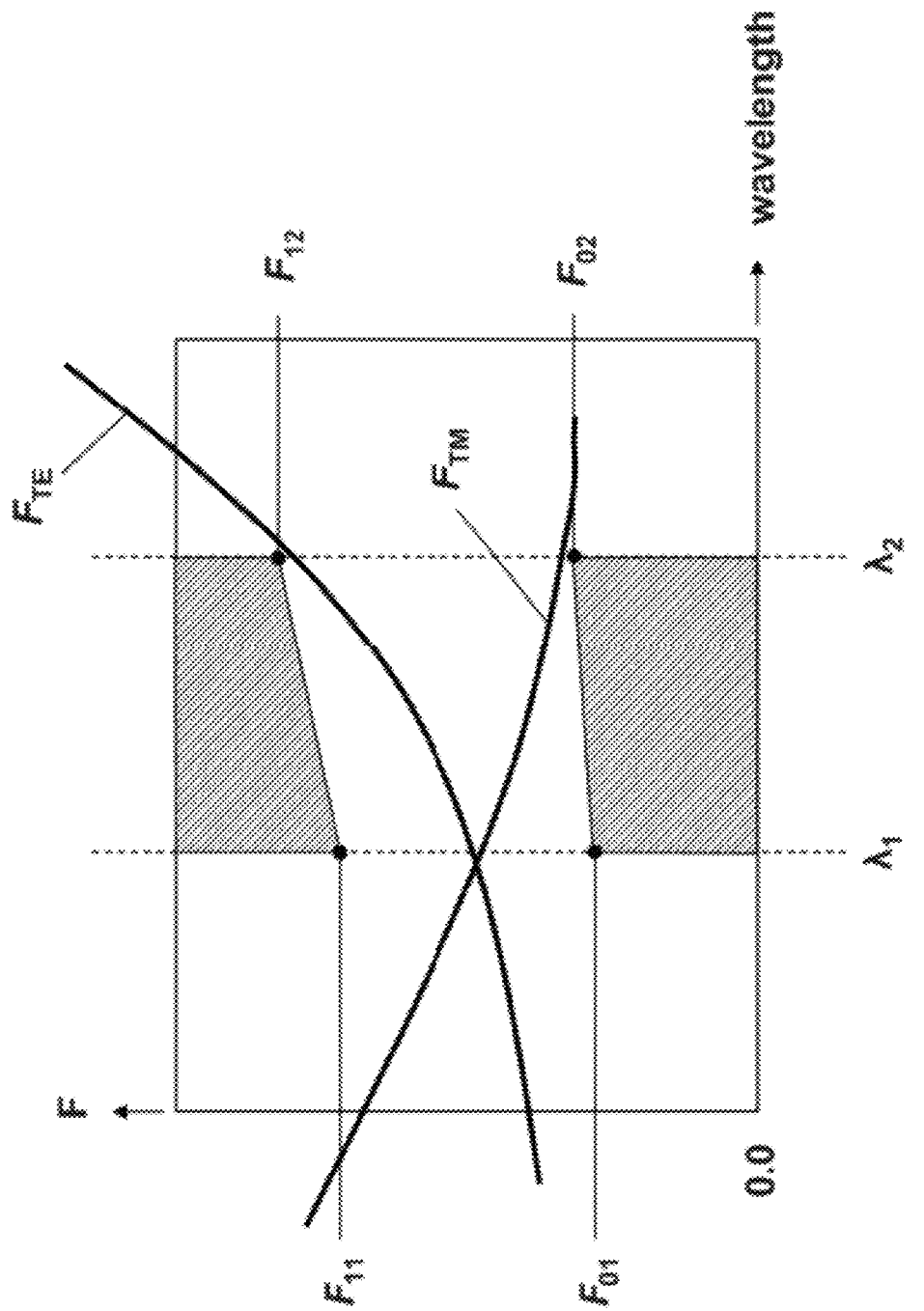
FIG. 14 is a coating design box plot.

The spectral characteristics of an exemplary polarizing optical coating for use with a semiconductor emitter of unpolarized light are shown on FIG. 13. The dashed line on FIG. 14 represents $F_{TE}(\lambda)$; the solid line is $F_{TM}(\lambda)$ and the dotted line is $F_{UP}(\lambda)$ computed for the prior parameters. The $F_{TE}$ and $F_{TM}$ spectra of this exemplary coating are substantially linear while the $F_{UP}$ spectrum is a quadratic function of wavelength. This is not apparent at the plot scale of FIG. 13.

If it is further assumed that the peak wavelength of a RCLED emission spectrum is 650 nm at a device temperature $T_O$, and the relative slope at 650 nm is −1680 ppm/nm. Using $\beta=0.07$ nm/° C. typical of RCLEDs, gives a relative slope of −118 ppm/° C. and this exemplary coating will therefore compensate for a H spectrum having a relative slope of +118 ppm/° C. The exemplary coating has a crossover wavelength of 665 nm, however, the $F_{TE}$ and $F_{TM}$ spectra can be substantially parallel in the wavelength band and have slopes and average magnitudes such that the $F_{UP}$ spectrum meets the design criteria for a particular system. Many characteristics of the F and H spectra are possible and exemplary characteristics described herein do not limit the scope of the disclosure.

Conditions for Optimization of Coating for linearly polarized light: An optimal coating is defined for a known function H($\lambda$,T) over a specified wavelength band and range of incidence angles. The temperature dependence of H($\lambda$,T) is converted to wavelength equivalents using the factor $1/\beta=dT/d\lambda$ to give the function H($\lambda$) required for coating design. Any coating design is described using F ratios for the TE and TM polarizations and their variation over the wavelength band and range of incidence angles, and to have error-compensating qualities, the slopes of the functions $H\cdot F_{TM}(\lambda)$ and $H\cdot F_{TE}(\lambda)$ must not be zero. In one embodiment, the preferred coating satisfies relationships $d(H\cdot F_{TE})/d\lambda<0$ and $d(H\cdot F_{TM})/d\lambda>0$ and in a variation of the embodiment, the inequalities in the relationships are simultaneously reversed. In other words, the slopes of the F spectra of an optical coating on the single-surface beamsplitter have opposite signs. A further requirement of the design is that the coating satisfy the relationship $(dF_{TE}/d\lambda)/F_{TE}>-(dH/d\lambda)/H$ and $(dF_{TM}/d\lambda)/F_{TM}<-(dH/d\lambda)/H$ in the wavelength band and over the entire range of incidence angles. Switching the terms $F_{TE}$ and $F_{TM}$ in the foregoing relationship is an equivalent and satisfactory condition. The coating spectra should be specified for the manufacturer without the parameter H because he cannot include it as a design parameter nor can he test a witness piece in such a way to include the factor H. The optimization procedure, however, must include it. In yet another variation, the optimal coating design exhibits at least one wavelength $\lambda_X$ within the wavelength band at which $H \cdot F_{TE} = H \cdot F_{TM}$, however, $\lambda_X$ does not have to be in the wavelength band to function in accordance with the disclosure. The coating spectra will ideally be linear and therefore the location of $\lambda_X$ relative to the center of the wavelength band does not affect the maximum relative error and performance. Practical coatings, however, will invariably have curvature, they will be nonlinear, and the slopes of the F spectra change as the wavelength of the source departs from $\lambda_X$. This introduces errors that increase with $\lambda - \lambda_X$, and for this reason, it is preferred to operate near $\lambda_X$ and to have $\lambda_X$ be approximately centered within the wavelength band.

FIG. 14 shows the allowed locus of the $F_{TE}(\lambda)$ and $F_{TM}(\lambda)$ spectra of the preferred coating in the $\lambda$-F space and illustrates yet another condition on the optimal coating. In the $\lambda$-F space shown in FIG. 14, there are two shaded areas: The top shaded area is bound by $\lambda_1$ and $\lambda_2$ along the wavelength axis and it is bound from below by the straight line that connects points $(\lambda_1, F_{11})$ and $(\lambda_2, F_{12})$. The top shaded area is not bound from above. The bottom shaded area is bound by $\lambda_1$ and $\lambda_2$ along the wavelength axis and it is bound from above by the straight line that connects points $(\lambda_1, F_{01})$ and $(\lambda_2, F_{02})$. The bottom shaded area is bound from below with the F=0 axis. The $F_{TE}$ and $F_{TM}$ functions associated with the preferred coating extend from wavelengths below $\lambda_1$ to wavelengths larger than $\lambda_2$, and neither traverses shaded area. This condition is illustrated in FIG. 14 with exemplary functions $F_{TE}$ and $F_{TM}$.

The values $\lambda_1$, $\lambda_2$, $F_{01}$, $F_{11}$, $F_{02}$, $F_{12}$ are defined next. The wavelengths $\lambda_1$ and $\lambda_2$ define the boundaries of the wavelength band. The wavelength band $(\lambda_2-\lambda_1)$ is related to the temperature range $\Delta T$ [° C.] through semiconductor light emitter wavelength change with temperature $\beta$ [nm/° C.] via $(\lambda_2-\lambda_1) = \beta \cdot \Delta T$ and the batch tolerance of VCSEL wavelength. To define the other parameters the designer of the high-stability light source specifies the desired worst-case relative control error per degree of temperature $\Phi_{WC}$ in ppm/° C., the desired average reflectivity $R_{BS}$ of the single-surface beam splitter, the worst-case starting-polarization-angle $\phi_0$ adjustment resolution $\Delta \phi$ [rad], and the wavelength dependence of the factor $H(\lambda)$. The procedure goes as follows: (1) $H(\lambda)$ is averaged in the wavelength band and is called $\overline{H}$; (2) target F value is calculated as $F_{target} = (1-R_{BS})/R_{BS}$; and (3) the adjoining corners of the shaded areas are given by $$F_{01} = F_{target} \frac{\overline{H}}{H(\lambda_1)} \left(1 - \frac{\Phi_{WC} \Delta T}{2 \Delta \phi}\right) \quad (11)$$

$$F_{11} = F_{target} \frac{\overline{H}}{H(\lambda_1)} \left(1 + \frac{\Phi_{WC} \Delta T}{2 \Delta \phi}\right)$$

$$F_{02} = F_{target} \frac{\overline{H}}{H(\lambda_2)} \left(1 - \frac{\Phi_{WC} \Delta T}{2 \Delta \phi}\right)$$

$$F_{21} = F_{target} \frac{\overline{H}}{H(\lambda_2)} \left(1 + \frac{\Phi_{WC} \Delta T}{2 \Delta \phi}\right)$$

where $H(\lambda_1)$ and $H(\lambda_2)$ are the values of H at wavelengths $\lambda_1$ and $\lambda_2$, respectively.

An optimal coating will satisfy the aforementioned criteria with regard to magnitude and sign of the slopes of the $F_{TE}(\lambda)$ and $F_{TM}(\lambda)$ as well as the locus shown in FIG. 14 for all angles of incidence. The more accurate the initial adjustment is, the wider the spread between $F_{TE}(\lambda)$ and $F_{TM}(\lambda)$ can be since the horizontal line runs through $F_{target}$. In another embodiment of the optimal coating, the curvature of the F-spectra is limited.

For the purposes of this disclosure, the linearity of the F-spectra ($F(\lambda)$) for both TE and TM polarizations of a coating is defined above. The minimum linearity for any F-ratio within the wavelength range, any polarization, and any angle of incidence within the range of angles of incidence is equal to one minus twice (2) the relative control error per unit temperature multiplied by the temperature range.

Conditions for Optimization of Coating for unpolarized light: An optimal coating is defined for a known function $H(\lambda,T)$ over a specified wavelength band. The initial step in the coating specification process is to measure the system characteristics necessary to determine H over the wavelength band and then compute the relative slope at the peak wavelength. Next, the desired $F_{UP}$ at the peak wavelength is specified and the function $F_{UP}$ is defined over the wavelength band. Using a successive approximation, iterative analytical technique, or simple trial and error, the $F_{TE}$ and $F_{TM}$ spectra required to obtain the desired $F_{UP}$ spectrum are created and provided to the coating fabricator. The coating fabricator then applies the specified coating to the substrate beamsplitter material, typically BK7 or fused-silica glass, and measures the $F_{TE}$ and $F_{TM}$ spectra directly. The measured spectra are used to compute the $F_{UP}$ spectrum for determination of the degree of compensation in the light source. During assembly, the angle of incidence the light beam transmitted through the collimating lens can be adjusted to tune the $F_{UP}$ spectrum for improved compensation.

Curvature and nonlinear compensating functions: While it is preferred that the functions $H(\lambda)$ and $F(\lambda)$ as well as the functions describing factors to be compensated are substantially linear and independent of one another, the optimization scheme described herein works with nonlinear functions as well. These functions when linearly combined may be quadratics, polynomials, exponentials and the like. In order for a nonlinear function $H(\lambda)$ to be compensated by a function $F(\lambda)$ the two must have "inverse" curvature over the compensation region. There are many alternative ways to express the desired spectral characteristics of the coating of a highly stable light source. There are many other ways to specify the coating properties and quantify the control errors to realize the error-canceling benefits of the present embodiments and to maintain the spirit of the disclosure. A simple graph showing the functions $F_{TE}(\lambda)$ and $F_{TM}(\lambda)$ or $R_{TE}(\lambda)$ and $R_{TM}(\lambda)$ over the desired wavelength band may suffice.

The effect of angle of incidence uncertainty: An unavoidable characteristic of single-surface beamsplitters (air-to-dielectric or coated) is that their F spectra changes with the angle of incidence. Achieving an exact angle of incidence in production consistently will be a challenge if the tolerance of the angle is set too low. Small variations of the angle of incidence of the collimated beam on the first surface of the beam splitter resulting from misalignment of the semiconductor light emitter, beam-forming optics and beamsplitter cause lateral and vertical shifts of the F spectra, the crossover wavelength and change the curvature of the F spectra. Hence the design of the optical coating must accommodate variation of the angle of incidence as well as wavelength. It is important to note that the coating design cannot accommodate variation of incidence angles in uncollimated beams as they change in temperature and mode structure. This is because the F ratio at the crossover wavelength will vary, altering the reflection coupling of the system and causing control errors. In the design process, the numerical model of a coating must test the effect of incidence-angle tolerance over the wavelength band of the semiconductor light emitter and verify that the crossover wavelength lies within, or is near, the wavelength band and that the slopes of the F spectra maintain opposite signs and sufficient magnitude for compensation of the control errors. In addition, the as-built coating must also be characterized to verify these characteristics and requirements before it is used in production. In other words, the analysis as a function of the incidence angle has to be done with the largest angle that will occur in the final system. That maximum angle is a sum of assembly tolerance on the incidence angle and the diffraction angle of the collimated incident beam.

Design and Adjustment of High-stability Source Made with an Emitter of Polarized Light:

One embodiment of the preferred method of a high-stability light-source made with an emitter of polarized light, a VCSEL in an exemplary system, is as follows:

1) The range of peak wavelengths ($\lambda_{MIN}$ and $\lambda_{MAX}$) and the change in peak wavelength with the temperature of the semiconductor light emitter $d\lambda/dT$ are measured or obtained from accurate data supplied by the manufacturer for the semiconductor light emitter.

2) The polarization state and change in polarization angle with the temperature of the semiconductor light emitter $d\phi/dT$ are measured or otherwise obtained.

3) The variation of beam divergence with the temperature and drive current of the semiconductor light emitter are measured or obtained from accurate data supplied by the manufacturer for the semiconductor light emitter.

4) The wavelength and temperature dependence of the photodetector responsivity, $\partial S/\partial \lambda$ and $\partial S/\partial T$, are measured or obtained from manufacturers' data.

5) The coupling efficiency of the reflected and transmitted beams $\eta_X(I,\lambda,T)$ and $\partial_R(I,\lambda,T)$ are determined from the beam divergence and the optical characteristics of the beamsplitter.

6) The function $H(\lambda,T)$ is computed using the parameters determined in steps four and five above.

7) The optical parameters of the optically transparent wedge are defined: at least the wedge angle $\alpha$ and refractive index of the glass. Based on this information, an optical coating is designed according to the specifications defined in section "Conditions for Optimal Coating Design for Linearly Polarized Light."

8) The coating is manufactured and characterized for F ratio as a function of wavelength: determining $F_{TE}(\lambda)$ and $F_{TM}(\lambda)$, and hence the complete function given with equation (10). The coating is characterized at the minimum and maximum incidence angle to verify that the curve slopes, curvature and crossover wavelengths are adequate.

9) A monogram chart, illustrated in FIG. 11, is constructed numerically from the known data on the semiconductor light emitter, photodetector, coupling coefficients, and the coating.

10) The optimal starting polarization angle $\phi_0$ for which the product $H(T)F(T)$ exhibits smallest variation over the operating temperature range ($T_{min}$ to $T_{max}$) is determined by means of optimization (least square, for example).

11) The light-source system is built and the semiconductor light emitter is positioned with its polarization axis relative to the beamsplitter determined by $\phi_0$ in a first embodiment.

Design and Adjustment of High-stability Source Made with an Emitter of Unpolarized Light:

In another embodiment of the preferred method of high-stability light-source made with an emitter of unpolarized light, a RCLED in exemplary system, is as follows:

1) The range of peak wavelengths ($\lambda_{MIN}$ and $\lambda_{MAX}$) and the change in peak wavelength with the temperature of the semiconductor light emitter $d\lambda/dT$ are measured or obtained from data supplied by the manufacturer for the semiconductor light emitter.

2) The variation of beam divergence with the temperature and drive current of the semiconductor light emitter are measured or obtained from data supplied by the manufacturer for the semiconductor light emitter.

3) The wavelength and temperature dependence of the photodetector responsivity, $\partial S/\partial \lambda$ and $\partial S/\partial T$, are measured or obtained from manufacturers' data.

4) The coupling efficiency of the reflected and transmitted beams $\eta_X(I,\lambda,T)$ and $\eta_R(I,\lambda,T)$ are determined from the variation of beam divergence with the temperature and drive current of the semiconductor light emitter and beamsplitter characteristics.

5) The function $H(\lambda,T)$ is computed using the parameters determined in steps three and four above.

6) Based on the refractive index of the glass in the optically transparent plate and range of angles of incidence, an optical coating is designed according to the specifications defined in section "Conditions for Optimal Coating Design for Unpolarized Light."

7) The coating is manufactured and the spectra $F_{TE}(\lambda)$ and $F_{TM}(\lambda)$ are determined at the minimum and maximum incidence angle to verify that the curve slopes, curvature and crossover wavelengths are as required (verification that coating meets specifications).

8) The light-source system is built.

High-Stability Light Source Apparatus Design

As shown in FIG. 15A, one embodiment of a stable light source 20 includes a header 30 having a top header surface 32 and pedestal 34 upon which is mounted a semiconductor light emitter 36 that emits an emitter light beam 38. The emitter beam 38 has a divergence angle (not shown in FIG. 15A) that contains substantially all of the coherent optical power emitter by the semiconductor light emitter 36. Typical divergence angles of VCSELs range from 15° to 30°. The emitter beam 38 passes through a first aperture 40 in the top side of a light enclosure 42, which contains substantially all of the spontaneous and scattered emissions (stray light) from the semiconductor light emitter 36 blocking and preventing it from impinging on a light-sensitive surface 44 of a photodetector 46. The light enclosure 42 is a cavity in a structure 48 that extends upward from the top header surface 32 of the header 30 and is concentric with the emitter beam 38.

An optically transparent plate 54 is supported in a first slot 56 (not shown on FIG. 15A) and a second slot 58 in the structure 48 such that it subtends an acute angle of preferably 45° to the optical axis of the emitter beam 38. The plate 54 extends over the semiconductor light emitter 36 and reflects a portion of the emitter beam 38 to form a first-reflected beam 50, which is transverse to the emitter beam 38. A beam is reflected from the second surface of the beamsplitter and is transmitted through the first surface to form a second-reflected beam 52 (not shown on FIG. 15A). The offset of the second-reflected beam 52 with respect to first-reflected beam 50 is approximately one-half the thickness of the beamsplitter. The second-reflected beam 52 has approximately 0.5% of the intensity of the first-reflected beam 50.

The optically transparent plate 54 is a transparent dielectric (glass) plate and is preferably made of a high-index glass such as SF11 (n=1.78) of N-LaSF9 (n=1.85) so as to increase the intensity of the first-reflected beam 50 and the signal-to-noise ratio of the stable light source 20. The light in emitter beam 38 that is not reflected and is transmitted through a first surface 60 of the optically transparent plate 54 is incident on second surface 62 of the optically transparent plate 54 and is transmitted through the second aperture 64 in the form of transmitted beam 66. The second surface 62 preferably has an antireflection coating 68 that increases the intensities of the transmitted beam 66 and the output beam 70 and reduces the modulation depth of the circular interference fringes in the transmitted beam 66.

The photodetector 46 is mounted on a surface 72 of the structure 48 for receiving the first and second reflected beams 50 and 52. The photodetector 46 is mounted so that its light-sensitive surface 44 is oriented 90° to the optical axis of the first and second reflected beams 50 and 52, which intersects the geometric center of the light-sensitive surface 44. A field stop 88 permits the first-reflected beam 50 to impinge upon the light-sensitive surface 44 of the photodetector 46 while blocking substantially all spurious light radiated from the structure 48 that might otherwise interfere with the accurate control of the stable light source 20.

The light-sensitive surface 44 of the photodetector 46 is larger than and completely overlaps the field stop 88. The structure 48 is keyed to the header 30 by the pedestal 34 so that it can freely rotate either CW or CCW in order to set the initial polarization angle $\phi_0$. A first electrically conductive pad 74 on the face of the photodetector 46 exposed to the first-reflected beam 50 is bonded to a first conductive trace 76 on the surface 72 of the structure 48 that extends to near the end of the structure 48 but does not contact the top header surface 32 of the header 30. An electrical connection between the first conductive trace 76 and the photodetector-anode lead 78 is made with a bond wire 80 after final adjustments of the polarization angle are complete. The photodetector-anode lead 78 passes through and is insulated from the header 30 by a glass sleeve 82. The cathode of the photodetector 46 is connected to a second conductive trace 84 on the surface 72 by a second electrically conductive pad 90 on the photodetector 46. The second conductive trace 84 and the cathode of the photodetector 46 are connected to the header 30 and the common lead 92 by solder or conductive epoxy.

Figure 15B:
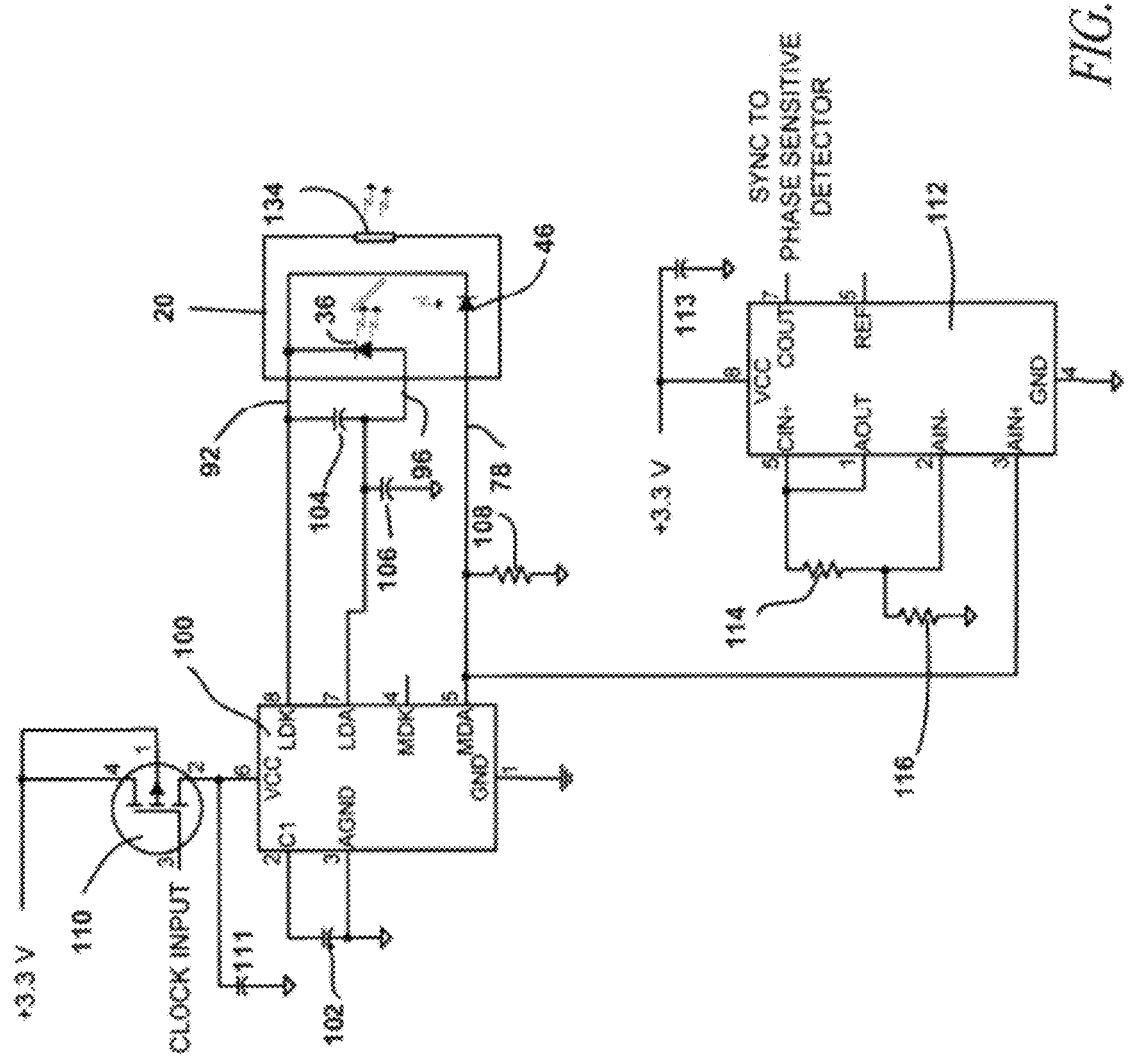
FIG. 15B is an example electronic control circuit for the stable light source apparatus of FIG. 15A.

A wire 94 connects the emitter anode lead 96, which passes through and is insulated from the header 30 by a glass sleeve 82, to the anode of the semiconductor light emitter 36. As shown in FIG. 15B, the stable light source 20 has a common lead 92 connected to the terminal LDK of an integrated circuit 100, has an emitter anode lead 96 connected to the terminal LDA of the circuit 100, and has the photodetector-anode lead 78 connected to the MDA terminal of the circuit 100. The integrated circuit 100 is a commercially available unit IC-WKL or the like which with capacitor 102, capacitor 104 and capacitor 106 and resistor 108 maintains a set light output intensity from the stable light source 20 by sensing the current through the photodetector 46 and adjusting the current through the semiconductor light emitter 36 to maintain the set light output intensity.

When the stable light source 20 is employed as a light source for sensing turbidity, fluid borne particles, etc., the input power to the integrated circuit 100 can be turned on and off by a driver 110 and decoupling capacitors 111 and 113 to thus produce a pulsed light output from the stable light source 20 and a voltage comparator 112. A voltage comparator 112 can be connected to the photodetector-anode lead 78 and configured by a first resistor 114 and a second resistor 116 to produce a sync pulse signal, which can be used by a synchronous detector circuit (not shown) to detect turbidity, concentration of fluid borne particles, etc.

The length and width of the optically transparent plate 54 are adequately sized to intersect substantially all the emitter beam 38 when the temperature of the stable light source 20 and drive current of the semiconductor light emitter 36 are both at the maximum levels for the intended application. The transmitted beam is incident upon a collimating lens 118 that is mounted in an optic cavity 120 of structure 48 such that the optical axis of the lens is collinear with the optical axis of the output beam 70.

The distance between the collimating lens and emitting surface of the semiconductor light emitter 36 is set by a lens shoulder 122 such that collimating lens 118 focuses an output beam 70 comprised of light rays that are substantially parallel to one another. The collimating lens 118 has second antireflection coatings 124. In one variation of the embodiment, an optical filter 132 with third antireflection coatings 126 is inserted in the output beam 70 to transmit substantially all of the power to the intended destination while attenuating substantially all of external light from the sun, artificial sources, etc., that may enter an enclosure cap 128 of the stable light source 20. In situations where the external light is diffused, an absorptive type optical filter is used; and an interference filter is preferably used when the external light enters an exit pupil 130 substantially parallel to the output beam 70. A window 134 with forth antireflection coatings 138 replaces optical filter 132 in situations where external light is absent. The collimating lens 118 and optical filter 132 are not essential for the proper function of the system; rather, they are optional features.

The exit pupil 130 is dimensioned to be no larger than 1.5 times the diameter of the output beam 70. In the variation having the optical filter to attenuate external light, the height of the enclosure cap 128 is made at least three to seven times the diameter of the exit pupil 130. The window 134 or optical filter 132 hermetically seal the enclosure cap 128 and prevent contaminants, water vapor, and dust from entering the stable light source 20.

Several advantages of this structure over the prior designs are: i) the solid angle of ambient light entering the unit through exit pupil 130 and incident upon the photodetector 46 is small, ii) the angle of incidence of external light is greater than 60° and so it is strongly reflected by the photodetector 46 and iii) the optically transparent plate 54 reflects a substantial fraction of the external light away from the photodetector 46. Thus the stable light source with optical feedback in accordance with the disclosure has substantially reduced susceptibility to external light affecting automatic power control of the intensity of the output beam 70.

The header 30 is a conventional header used in the manufacture of semiconductor devices and has at least three leads wherein the emitter anode lead 96 and photodetector-anode lead 78 are insulated from the header 30 by glass sleeves. The common lead 92 in this embodiment is joined and electrically connected to the header 30 but alternatively could be insulated in the manner of the anode leads for the emitter and photodetector. The header 30 has a flange 136 to which the enclosure cap 128 is bonded; the enclosure cap 128 can be mounted on the base by any other alternative structure. The header 30 can be plated with gold and the semiconductor light emitter 36 is bonded directly to top header surface 32 by a conductive epoxy, solder or other suitable material with the cathode electrode thereof joined to the header 30 and thus to the common lead 92. Typically, the header 30 is a Kovar nickel-iron alloy having temperature expansion coefficient similar to glass and silicon.

The structure 48 is black, light-absorbing ceramic or other rigid, low thermal expansion material. Black ceramic is chosen for absorption of external and stray light and for having a temperature expansion coefficient similar to that of the header metal, the glass sleeves and the leads; where ambient light is not a factor, the vertical member can be any other suitable material. In a further variation, the semiconductor light emitter is positioned on the pedestal 34 of the header 30 with a pick and place machine to obtain the TE incidence and to minimize the control error caused by polarization drift during varying operating conditions. The optical axes of the emitter beam 38, the transmitted beam 66 and the output beam 70 are parallel, however, the optical axes of beams 66 and 70 are offset from the optical axis of emitter beam 38 by a distance determined by the index of refraction of the glass from which the optically transparent plate 54 is made. The optical axes of the collimating lens 118, optical filter 132, and window 134 are offset accordingly to align these optical elements to the beams 66 and 70.

The azimuth angle of the first-reflected beam 50 with respect to the semiconductor light emitter 36 is controlled by rotating the structure 48 about the axis of the emitter beam 38. In the assembly process, the semiconductor light emitter 36 is placed such that the center of its emitting area lies directly over the geometrical center of the pedestal 34 on header 30 and is affixed to pedestal 34 with conductive epoxy in a position determined approximately by the angle of the electric field of the emitter beam 38 as determined by prior characterization of the polarization angle. Final accurate adjustment of the beamsplitter plane of incidence with respect to the electric field of the emitter beam 38 is made by rotation of the structure with integral beamsplitter and photodetector about the axis of the emitter beam 38 so as to produce the maximum output signal level from the photodetector. The signal from the photodetector is recorded by a test meter temporarily connected to first conductive trace 76 and second conductive trace 84 on structure 48. This position coincides with TE polarization and achieves the lowest control error resulting from polarization drift. There are many different structures and methods to configure the above listed components and to accomplish the stated functional objectives. Other combinations are possible and are in keeping with the spirit of the disclosure.

Figure 16A:
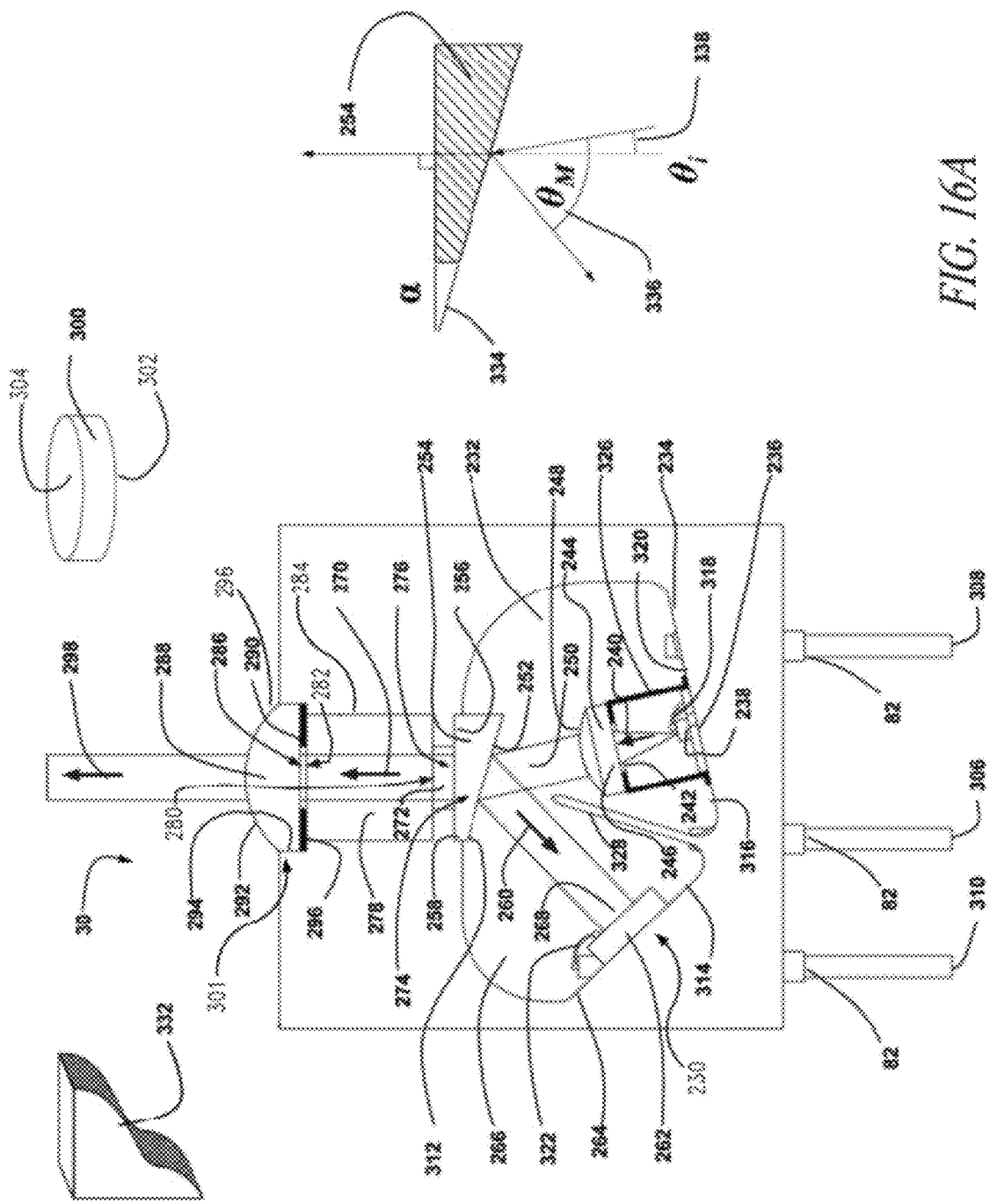
FIG. 16A is a second embodiment of a stable light source apparatus formed in accordance with the present disclosure.

As shown in FIG. 16A a second embodiment of a stable light source 30 includes a housing 230 having an emitter cavity 232 with a base 234 comprising a pedestal 236 upon which is mounted a semiconductor light emitter 238 that projects an emitter beam 240 through a first aperture 242. The emitter beam 240 has a divergence angle that contains substantially all of the coherent optical power emitted by the semiconductor light emitter 238. The emitter beam 240 is incident on first collimating lens 244 having first antireflection coating 246 and second antireflection coating 248, which focuses the emitter beam 240 into a collimated beam 250 comprised of light rays that are substantially parallel to one another. The collimated beam 250 is incident upon the first surface 252 of a beamsplitter 254. The beamsplitter 254 is aligned with respect to the emitter beam 240 by a beamsplitter shoulder 256 in a beamsplitter cavity 258. The first surface 252 reflects a portion of the collimated beam 250 to form a reflected beam 260.

A photodetector 262 is mounted on the photodetector base 264 of detector cavity 266 to receive the reflected beam 260. The photodetector 262 is mounted so that its detector cavity 266 is oriented perpendicular to the optical axis of the reflected beam 260 so its optical axis intersects the geometric center of the light-sensitive area 268. The length and width of the first surface 252 and light-sensitive area 268 must be adequately sized to intersect substantially all the reflected beam 260 when the device temperature and drive current of the semiconductor light emitter 238 are both at the maximum levels for the intended application. The transmitted beam 260 passing through first surface 252 is not reflected and is normally incident upon the second surface 272, which has a third antireflective coating 274 that prevents substantially all reflection of the transmitted beam from the second surface 272, increases the intensity of the transmitter beam 270 and the overall efficiency of the stable light source 30. The beam exiting from the second surface 272 passes through second aperture 276 whereupon it is incident on optical filter 278 having fourth antireflection coating 280 and fifth antireflection coating 282 in filter cavity 284, which transmits substantially all of the power to the intended destination while attenuating most of external light from the sun, artificial sources, etc., that may enter the third aperture 286 of the stable light source 30. Output optic 288 with a sixth antireflection coating 290 and a seventh antireflection coating 292, is mounted in optic cavity 294 with focus established by optic shoulder 296 such that the optical axes of the optical filter 278, output optic 288, and the geometric center of second surface 272 are collinear with the optical axes of the transmitted beam 270 and the output beam 298. The output optic couples the transmitted beam 270 into an output beam 298.

In another variation of this embodiment, the optical filter 278 or the output optic 288 or both can be omitted and a window 300 having eighth antireflection coating 302 and ninth antireflection coating 304 is placed in the optical cavity 301 to seal the unit and prevent the entry of atmospheric contaminants, moisture and dust into the interior of the stable light source 30. The optical filter 278 and output optic 288 are not essential for the proper function of the system. They are optional features.

The circuit shown in FIG. 15B can be used with the embodiment of FIG. 16A. In a variation of the invention shown in FIG. 16A, an optical coating 312 is applied to the first surface 252 of the beamsplitter 254 to increase the intensity of the reflected beam 260 and the control signal strength ($V_R$). The optical coating 312 has other advantages, including without limitation providing substantial compensation for interfering factors, such as the drift with temperature and drive current through the semiconductor light emitter 238, wavelength, polarization beam divergence and photodetector responsivity dS/dT as explained above in the background section. The first aperture 242, the second aperture 276, and the third aperture 286 are preferably dimensioned to be approximately 1.5 times the diameter of the emitter beam 240, the transmitted beam 270, and the output beam 298, respectively, in order to reduce the intensity of external light entering the interior of stable light source 30 and to block said external light from directly impinging on the photodetector 262.

Advantages of this structure over the prior devices are: i) the solid angle of ambient light entering the unit through second aperture 276 and third aperture 286 is substantially reduced from prior art intensities, ii) there is no direct light path by which external light can reach the photodetector 262 and said light is strongly reflected by the first surface 252 of beamsplitter 254 away from the photodetector 262. Thus the stable light source 30 with optical feedback in accordance with the disclosure has substantially reduced susceptibility to external light affecting automatic power control of the intensity of the output beam 298.

In another variation of the disclosure, the semiconductor light emitter 238 is mounted in a conventional ceramic SMD package and the micro lens is placed on a plate of glass to achieve the correct focal length and collimation. In either variation, the polarization angle of the semiconductor light emitter 238 must be accurately determined such that the initial calibration polarization angle can be set during assembly. The procedure for determining the initial calibration polarization angle is explained in later text.

The housing 230 is a manufactured part and has at least three leads 306, 308, and 310 that are fired into holes in the housing 230 with conventional glass seals 82 (as shown in FIG. 15A). The common lead 306 is connected to a first conductive trace 314 on the photodetector base 264 of detector cavity 266 and a second conductive trace 316 on the base 234 of the emitter cavity 232. A wire 318 connects the anode electrode of the semiconductor light emitter 238 to the third conductive trace 320 which is connected to semiconductor light emitter anode lead 308 with solder or conductive epoxy. A second wire 322 connects the anode of the photodetector 262 to the photodetector anode lead 310, and the cathodes of the semiconductor light emitter 238 and photodetector 262 are connected via first conductive trace 314 and second conductive trace 316 and common lead 306 with solder or conductive epoxy. Stray light emitted from the semiconductor light emitter 238 is prevented from impinging upon photodetector 262 by enclosure cap 326 and light baffle 328. The height of enclosure cap 326 sets the focal length of first collimating lens 244. In a variation of the disclosure, stray light emitted by semiconductor light emitter 238 is captured and absorbed within a cavity in a submount 330 (not shown).

The housing 230 is black, light-absorbing ceramic or other rigid, low thermal expansion material. Black ceramic is chosen for absorption of external and stray light and for having a temperature expansion coefficient similar to that of the header metal, the glass sleeves and the leads; where ambient light is not a factor, the housing 230 can be any other material with suitable thermal expansion properties. The housing cover 332 is bonded to the housing 230 with epoxy under a vacuum to form a hermetically sealed enclosure around stable light source 30.

The beamsplitter 254 is made of a transparent dielectric material (glass) with a wedge angle ($\alpha$) 334, reflection angle ($\theta_M$) 336 and deviation angle ($\theta_i$) 338 determined by equations 6 and 7. The reflection angle 336 is shown to be 60°, however, any acute angle between 50° and 90° can be used and the benefit of reduced interference from external light will be realized. In one variation of the embodiment wherein the first surface 252 of the beamsplitter 254 is uncoated, the wedge material would preferably be a non-birefringent glass with a high index of refraction such as SF11 or N-LaSF9.

Figure 16B:
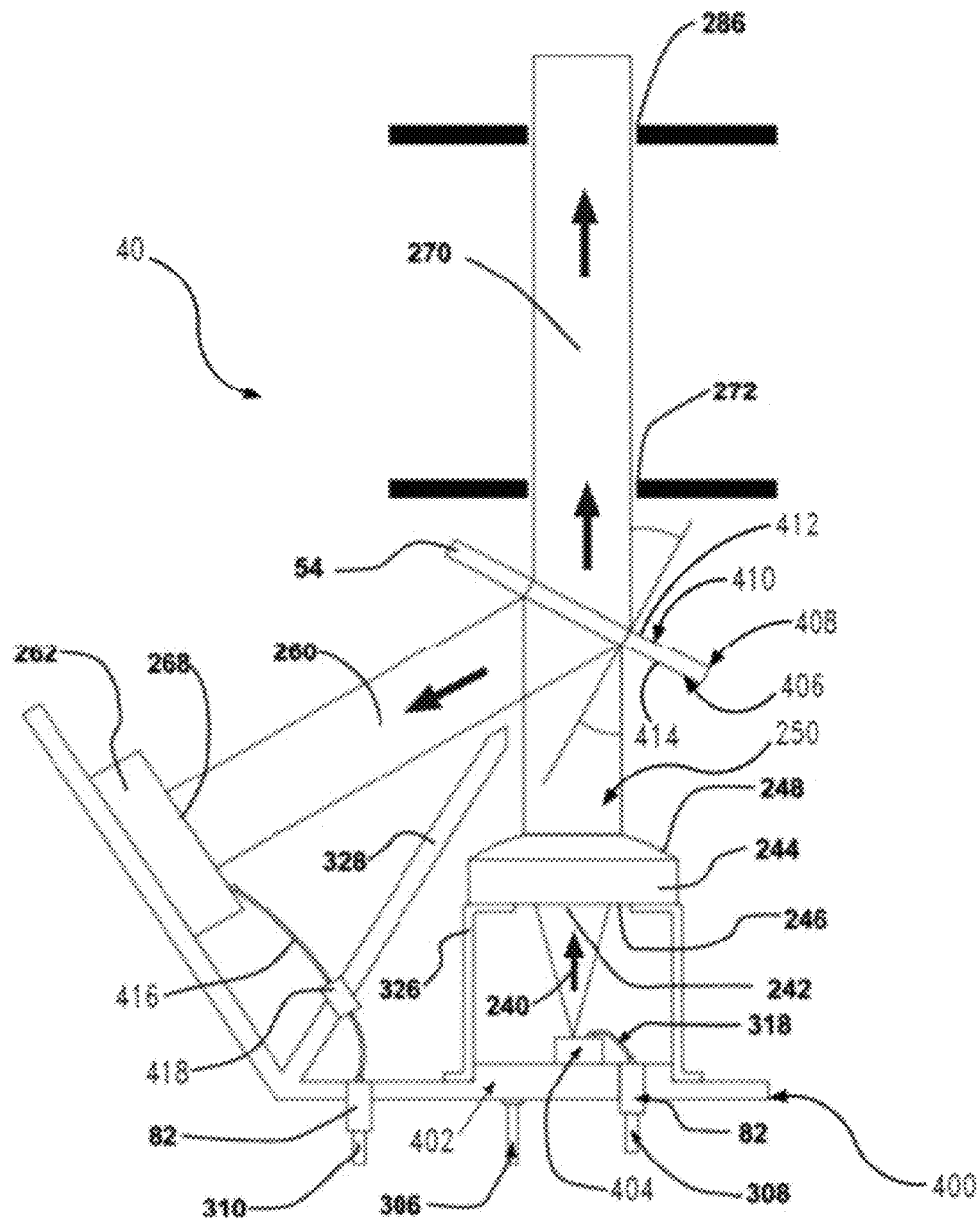
FIG. 16B is a variation of the second embodiment of the stable light source apparatus of FIG. 16A having an emitter of unpolarized light.

In a further variation shown in FIG. 16B, the semiconductor light emitter 404 is positioned across a fifth conductive trace 340 (not shown in FIG. 16B) and a sixth conductive trace 342 (not shown in FIG. 16B) on the pedestal 402 in the emitter cavity 232 with a pick and place machine to obtain the TE incidence and to minimize the control error caused by polarization drift during varying operating conditions. As shown in FIG. 16B a variation of the second embodiment of a stable light source 40 includes a housing and emitter cavity (not shown) and a base 400 comprising a pedestal 402 upon which is mounted a semiconductor light emitter 404, a RCLED in the variation, that projects an emitter beam 240 through a first aperture 242. The emitter beam 240 has a divergence angle that contains substantially all of the optical power emitted by the semiconductor light emitter 404. The emitter beam 240 is incident on first collimating lens 244 having first antireflection coating 246 and second antireflection coating 248, which focuses the emitter beam 240 into a collimated beam 250 comprised of light rays that are substantially parallel to one another. The collimated beam 250 is incident upon the first surface 406 of an optically transparent plate 408. The first surface 406 reflects a portion of the collimated beam 250 to form a reflected beam 260. A photodetector 262 is mounted on the base 400 to receive the reflected beam 260. The photodetector 262 is mounted so that its light-sensitive area 268 is oriented perpendicular to the optical axis of the reflected beam 260 and said axis intersects the geometric center of the light-sensitive area 268. The length and width of the first surface 406 and light-sensitive area 268 must be adequately sized to intersect substantially all the reflected beam 260 when the device temperature and drive current of the semiconductor light emitter 404 are both at the maximum levels for the intended application. The transmitted beam 260 passing through first surface 406 is not reflected and is normally incident upon the second surface 410 which has antireflective coating 412 that prevents substantially all reflection of the transmitted beam from the second surface 410, increases the intensity of the transmitter beam 270 and the overall efficiency of the stable light source 40. The beam exiting from the second surface 410 passes through second aperture 272 and third aperture 286.

The circuit shown in FIG. 15B can be used with the variation of the embodiment of FIG. 16B. In a variation of the invention shown in FIG. 16B, an optical coating 414 is applied to the first surface 406 of the optically transparent plate 408 to increase the intensity of the reflected beam 260 and the control signal strength ($V_R$). The optical coating 414 has other advantageous qualities such as providing substantial compensation for interfering factors such as the drift with temperature and drive current through the semiconductor light emitter 404, wavelength, polarization beam divergence and photodetector responsivity as explained in the background section.

The second aperture 276 and the third aperture 286 are preferably dimensioned to be approximately 1.5 times the diameter of the transmitted beam 270 in order to reduce the intensity of external light entering the interior of stable light source 40 and to block said external light from directly impinging on the photodetector 262. Advantages of this structure over the prior designs are: i) the solid angle of ambient light entering the unit through second aperture 276 and third aperture 286 is substantially reduced from prior art intensities, ii) there is no direct light path by which external light can reach the photodetector 262 and said light is strongly reflected by the first surface 406 of optically transparent plate 408 away from the photodetector 262. Thus the stable light source 40 with optical feedback in accordance with the disclosure has substantially reduced susceptibility to external light affecting automatic power control of the intensity of the transmitted beam 270.

The variation has at least the three leads 306, 308 and 310 that are fired into holes in the housing 230 with conventional glass seals 82 (as shown in FIGS. 16A and 16B). The common lead 306 is connected to a conductive base 400. A wire 318 connects the anode electrode of the semiconductor light emitter 404 to semiconductor light emitter anode lead 308. A second wire 416, insulated from baffle 328 by an insulator 418, connects the anode of the photodetector 262 to the photodetector anode lead 310. The cathodes of the semiconductor light emitter 404 and photodetector 262 are connected to conductive base 400. Stray light emitted from the semiconductor light emitter 404 is prevented from impinging upon photodetector 262 by enclosure cap 326 and light baffle 328. The height of enclosure cap 326 sets the focal length of collimating lens 244. There are many different structures and methods to configure the above listed components and to accomplish the stated functional objectives.

There are many different structures and methods to configure the above listed components and to accomplish the stated functional objectives. Other combinations are possible and are in keeping with the spirit of the invention. The various embodiments described above can be combined to provide further embodiments.

The foregoing disclosure will have practical application in a variety of technologies. These include, without limitation, particle counting and sizing (air and water), reflectometers and gloss meters, visibility and fog meters, opacity meters, molecular light-scattering instrumentation, and turbidity meters.

All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a semiconductor light emitter structured to emit a light beam of linearly polarized light having a beam polarization direction and an optical axis;
a beamsplitter comprising a first optical surface and a second optical surface, the second optical surface being substantially parallel to the first optical surface, the first optical surface structured to reflect a first portion of the light beam and to transmit a second portion of the light beam there through, the optical axis of the light beam and a normal to the first optical surface defining a plane of incidence, wherein the beam polarization direction closes an acute angle with the plane of incidence and the beam polarization direction varies with temperature; and
a lens positioned to collimate the second portion of light.

2. The device of claim 1, wherein the semiconductor light emitter comprises a polarization-locked vertical-cavity surface-emitting laser.

3. The device of claim 1, further comprising:
a photodetector; and
an enclosure to prevent stray light emitted by the semiconductor light emitter from reaching the photodetector.

4. The device of claim 3, wherein the structure comprises a structure to shield the photodetector from external light or stray light emitted by the semiconductor light emitter.

5. A light source, comprising:
a semiconductor light emitter structured to emit a light beam of linearly polarized light having a peak emission wavelength in a wavelength band;
a beamsplitter having a first surface structured to reflect a first portion of the light beam and transmit a second portion of the light beam, the beamsplitter comprising an optical coating disposed on a first optical surface of the beamsplitter, the first optical surface structured to define a plane of incidence parallel to the light beam, the optical coating characterized with parameters $F_{TE}$ and $F_{TM}$ given for a range of angles of incidence and for wavelengths $\lambda$ within the wavelength band, $F_{TE}$ is defined as the ratio of power transmittance and power reflectance for light waves with polarization direction perpendicular to the plane of incidence, and $F_{TM}$ is defined as the ratio of power transmittance and power reflectance for light waves with polarization direction parallel to the plane of incidence,
wherein the parameters $F_{TE}$ and $F_{TM}$ exhibit the following property: either ($dF_{TE}/d\lambda>0$ and $dF_{TM}/d\lambda<0$) or ($dF_{TE}/d\lambda<0$ and $dF_{TM}/d\lambda>0$).

6. The light source of claim 5, wherein there is at least one wavelength within or near the wavelength band for which parameters $F_{TE}$ and $F_{TM}$ are equal.

7. The light source of claim 5, wherein the light beam has a degree of polarization of at least 80%, with the light beam having a beam polarization direction that closes an acute angle with the plane of incidence.

8. The light source of claim 7, wherein the beam polarization direction varies with semiconductor light emitter temperature.

9. The light source of claim 5, wherein the semiconductor light emitter is a polarization-locked vertical-cavity surface-emitting laser.

10. The light source of claim 5, wherein the range of angles of incidence is centered around 45 degrees.

11. The light source of claim 5, wherein the wavelength varies with the semiconductor light emitter temperature.

12. The light source of claim 5, wherein,
the beamsplitter further comprises a second optical surface inclined at an acute angle relative to the first optical surface; and
the second portion of the light beam has a direction substantially normal to the second surface.

13. The light source of claim 5, further comprising:
a photodetector;
a collimating lens positioned between the beamsplitter and the semiconductor light emitter; and
an enclosure to prevent stray light emitted by the semiconductor light emitter from reaching the photodetector.

14. The light source of claim 13, wherein the structure comprises a structure that shields the photodetector from external light or stray light emitted by the semiconductor light emitter.

15. The light source of claim 13, further comprising:
an electronic driver circuit structured to power the semiconductor light emitter; and
a transimpedance amplifier structured to receive a signal from the photodetector, the signal proportional to the intensity of either the first portion of the light beam or the second portion of the light beam, wherein the electronic driver circuit and the transimpedance amplifier are coupled together and structured to maintain the intensity of the second portion of the light beam or the first portion of the light beam, respectively, substantially unchanged over an operating-temperature range.

16. A light source, comprising:
a semiconductor light emitter structured to emit a light beam of unpolarized light having a peak emission wavelength $\lambda_e$ in a wavelength band, the peak emission wavelength variation with temperature T described with $\lambda_e(T)$, the temperature within an operating-temperature range;
a beamsplitter with a first surface structured to reflect a first portion of the light beam and transmit a second portion of the light beam, the beamsplitter comprising an optical coating disposed on a first optical surface of the beamsplitter, the first optical surface having a plane of incidence parallel to the light beam, the light beam incident on the optical coating at an angle of incidence within the range of angles of incidence, the coating characterized with parameters $F_{TE}$ and $F_{TM}$ given for a range of angles of incidence and for wavelengths $\lambda$ within the wavelength band, $F_{TE}$ defined as the ratio of power transmittance and power reflectance for light waves with polarization direction perpendicular to the plane of incidence, and $F_{TM}$ is defined as the ratio of power transmittance and power reflectance for light waves with polarization direction parallel to the plane of incidence;

a photodetector having a responsivity, the responsivity having a characteristic variation $S(\lambda,T)$ with wavelength $\lambda$ of incident light for all wavelengths in the wavelength band and with temperature in the operating-temperature range;

a collimating lens positioned between the beamsplitter and the semiconductor light emitter;

a light source characteristic H at least proportional to $1/S(\lambda_e, T)1/S$; and wherein the parameters $F_{UP}=\sqrt{F_{TE}^2+F_{TM}^2}$ and H exhibit the following property: either ($dF_{UP}/d\lambda>0$ and $dH/d\lambda<0$) or ($dF_{UP}/d\lambda<0$ and $dH/d\lambda>0$).

17. The light source of claim 16, wherein the variation of the product F and H varies less than 100 ppm/degree in the temperature range.

18. The light source of claim 16, wherein the light source characteristic H further includes the effects of beam divergence angle, beam divergence angle variation with temperature, and photodetector coupling efficiency.

19. The light source of claim 16, wherein the beamsplitter comprises a second surface that is substantially parallel to the first surface.

20. The light source of claim 16, wherein the semiconductor light emitter is a resonant-cavity light-emitting diode.

21. The light source of claim 16, wherein angles bounding the range of angles of incidence are $\pi/7$ and $\pi/3$.

22. A device, comprising:
a semiconductor light emitter structured to emit a light beam of linearly polarized light;
a photodetector;
a beamsplitter consisting of a first optical surface and a second optical surface that meet at an acute angle, the first optical surface of the beamsplitter structured to reflect a first portion of the light beam and to transmit a second portion of the light beam through the first and the second optical surfaces, the second portion of the light beam having a direction that is substantially normal to the second optical surface; and
a collimating lens positioned between the beamsplitter and the semiconductor light emitter.

23. The device of claim 22, further comprising a device for preventing stray light emitted by the semiconductor light emitter from reaching the photodetector.

24. The device of claim 22, further comprising a shield for shielding the photodetector from external light.

25. The device of claim 22, wherein the light beam has a degree of polarization of at least 80%.

26. The device of claim 25, wherein the semiconductor light emitter comprises a polarization-locked vertical-cavity surface-emitting laser.

27. A method for minimizing temperature sensitivity of a light output from a light source, comprising the steps of:
providing an operating-temperature range;
providing a range of angles of incidence;
providing a semiconductor light emitter structured to emit a beam of linearly polarized light having an emission wavelength, and a beam polarization direction, the emission wavelength having a characteristic variation $\lambda(T)$ with temperature T over the operating-temperature range, and the beam polarization direction having a characteristic variation $\phi(T)$ with temperature over the operating-temperature range;

defining a wavelength band to include at least all emission wavelengths in the operating-temperature range;

providing a photodetector having a responsivity, the responsivity having a characteristic variation $S(\lambda,T)$ with wavelength $\lambda$ of incident light for all wavelengths in the wavelength band and with temperature T over the operating-temperature range;

providing a beamsplitter comprising a first optical surface having a parameter $F_{TE}$ and a parameter $F_{TM}$ specified for the wavelength band and for the range of angles of incidence, parameter $F_{TE}$ defined as the ratio of power transmittance and power reflectance for light waves with a polarization direction perpendicular to a plane of incidence of the first surface, and parameter $F_{TM}$ defined as the ratio of power transmittance and power reflectance for light waves with polarization direction parallel to the plane of incidence;

defining a light source characteristic comprising at least $\lambda(T)$, $\phi(T)$, and $S(\lambda,T)$ characteristic variations;

assembling the light source so that the semiconductor light emitter is structured to emit a light beam, the light beam incident on the first optical surface, the first optical surface reflecting a first portion of the light beam and transmitting a second portion of the light beam;

determining a polarization angle between the plane of incidence of the first surface and the beam polarization direction using the light source characteristic and the parameters $F_{TE}$ and $F_{TM}$, for which variation in intensity of the first portion or the second portion of the light beam or both the first and second portions of the light beam over the operating-temperature range and over angles within the range of angles of incidence is at a minimum; and rotating the semiconductor light emitter around its optical axis to obtain the polarization angle.

28. The method of claim 27, wherein, either the first portion of the light beam or the second portion of the light beam is coupled to the photodetector with a coupling efficiency, and the light source characteristic further comprises the coupling efficiency, a beam divergence angle, and a beam divergence angle variation with temperature over the operating-temperature range.

29. The method of claim 27, wherein the wavelength band furthermore includes all wavelengths resulting from manufacturing variation of the semiconductor light emitter.

30. The method of claim 27, wherein the beamsplitter further includes a second optical surface inclined at an acute angle relative to the first optical surface, and the second portion of the light beam has a direction substantially normal to the second optical surface.

31. The method of claim 27, wherein the first optical surface comprises an optical coating disposed thereon, and the parameters $F_{TE}$ and $F_{TM}$ vary with a wavelength $\lambda$ as either ($dF_{TE}/d\lambda>0$ and $dF_{TM}/d\lambda<0$) or ($dF_{TE}/d\lambda<0$ and $dF_{TM}/d\lambda>0$) within the wavelength band and for all angles within the range of angles of incidence.

32. The method of claim 31, wherein there is at least one wavelength that is within or near the wavelength band for which parameter $F_{TE}$ is equal to parameter $F_{TM}$.

33. The method of claim 31, wherein either the first portion of the light beam or the second portion of the light beam is coupled to the photodetector with a coupling efficiency, and the light source characteristic further comprises the coupling efficiency, a beam divergence angle, and a beam divergence angle variation with temperature over the operating-temperature range.

34. The method of claim 31, wherein the wavelength band furthermore includes all wavelengths resulting from manufacturing variation of the semiconductor light emitter.

35. The method of claim 31, wherein the beamsplitter further includes a second optical surface inclined at an acute angle relative to the first optical surface, and the second portion of the light beam has a direction substantially normal to the second optical surface.

36. The method of claim 35, wherein the second optical surface is coated with an anti-reflective optical coating.

37. The method of claim 27, wherein the light beam is linearly polarized with a degree of polarization of at least 80%.

38. The method of claim 37, wherein the semiconductor light emitter is a polarization-locked vertical-cavity surface-emitting laser.

39. The method of claim 27, wherein the characteristic variation $\phi(T)$ comprises a non-negligible characteristic variation.

40. A method for minimizing temperature sensitivity of a light output from a light source, comprising the steps of:
  providing an operating-temperature range;
  providing a range of angles of incidence;
  providing a semiconductor light emitter structured to emit a beam of unpolarized light having an emission wavelength, the emission wavelength having a characteristic variation $\lambda(T)$ with temperature T over the operating-temperature range;
  defining a wavelength band to include at least all emission wavelengths in the operating-temperature range;
  providing a photodetector having a responsivity, the responsivity having a characteristic variation $S(\lambda,T)$ with wavelength $\lambda$ of incident light for all wavelengths in the wavelength band and with temperature T over the operating-temperature range;
  defining a light source characteristic comprising at least $\lambda(T)$ and $S(\lambda,T)$ characteristic variations;
  providing a beamsplitter comprising a first optical surface and a second optical surface that are substantially parallel;
  assembling the light source so that the semiconductor light emitter is structured to emit a light beam, the light beam to be incident on the first surface of the beamsplitter, the beamsplitter reflecting a first portion of the light beam and transmitting a second portion of the light beam;
  providing an optical coating disposed on the first optical surface with parameters $F_{TE}$ and $F_{TM}$ specified for the wavelength band and for the range of angles of incidence, parameter $F_{TE}$ defined as the ratio of power transmittance and power reflectance for light waves with polarization direction perpendicular to a plane of incidence of the first surface, and parameter $F_{TM}$ defined as the ratio of power transmittance and power reflectance for light waves with polarization direction parallel to the plane of incidence; and
  determining the values of the parameters $F_{TE}$ and $F_{TM}$ using the light source characteristic for which the variation in intensity of the first portion or the second portion of the light beam or both the first and the second portions of the light beam over the operating-temperature range and over angles within the range of angles of incidence is at a minimum.

41. The method of claim 40, wherein the parameters $F_{TE}$ and $F_{TM}$ vary with a wavelength $\lambda$ as either ($dF_{TE}/d\lambda > 0$ and $dF_{TM}/d\lambda < 0$) or ($dF_{TE}/d\lambda < 0$ and $dF_{TM}/d\lambda > 0$) within the wavelength band and for all angles within the range of angles of incidence or the $F_{TE}$ and $F_{TM}$ spectra can have slopes of the same sign and average magnitudes such that the parameters $F_{UP} = \sqrt{F_{TE}^2 + F_{TM}^2}$ and H exhibit the following property: either ($dF_{UP}/d\lambda > 0$ and $dH/d\lambda < 0$) or ($dF_{UP}/d\lambda < 0$ and $dH/d\lambda > 0$).

42. The method of claim 41, wherein there is at least one wavelength that is within or near the wavelength band for which parameter $F_{TE}$ is equal to parameter $F_{TM}$.

43. The method of claim 41, wherein either the first portion of the light beam or the second portion of the light beam is coupled to the photodetector with a coupling efficiency and the light source characteristic further comprises a beam divergence angle and beam divergence angle variation with temperature over the operating-temperature range.

44. The method of claim 41, wherein the wavelength band furthermore includes all wavelengths resulting from manufacturing variation of the semiconductor light emitter.

45. The method of claim 44, wherein the second surface is coated with an anti-reflective optical coating.

46. A method for minimizing temperature sensitivity of a light output from a light source, comprising the steps of:
  providing an operating-temperature range;
  providing a range of angles of incidence;
  providing a semiconductor light emitter structured to emit a beam of linearly polarized light having an emission wavelength, and a beam polarization direction, the emission wavelength varying with temperature over the operating-temperature range;
  defining a wavelength band to include at least all emission wavelengths in the operating-temperature range;
  providing a photodetector having a responsivity, the responsivity varying with wavelength of incident light with wavelength in the wavelength band and with temperature over the operating-temperature range;
  providing a beamsplitter comprising a first optical surface having a parameter $F_{TE}$ and a parameter $F_{TM}$ specified for the wavelength band and for the range of angles of incidence, parameter $F_{TE}$ defined as the ratio of power transmittance and power reflectance for light waves with polarization direction perpendicular to a plane of incidence of the first optical surface, and parameter $F_{TM}$ defined as the ratio of power transmittance and power reflectance for light waves with polarization direction parallel to the plane of incidence;
  assembling the light source so that the semiconductor light emitter is structured to emit a light beam, the light beam to be incident on the first optical surface, the first optical surface reflecting a first portion of the light beam and transmitting a second portion of the light beam; and
  rotating the semiconductor light emitter around its optical axis to set a polarization angle between the plane of incidence of the first optical surface and the beam polarization direction for which variation in intensity of the first portion of the light beam or the second portion of the light beam or both the first and second portions of the light beam over the operating-temperature range and over angles within the range of angles of incidence is at a minimum.

47. The method of claim 46, wherein the wavelength band furthermore includes all wavelengths resulting from manufacturing variation of the semiconductor light emitter.

48. The method of claim 46, wherein the beamsplitter further includes a second surface inclined at an acute angle relative to the first surface, and the second portion of the light beam has a direction substantially normal to the second surface.

49. The method of claim 46, wherein the first optical surface comprises an optical coating disposed thereon, and the parameters $F_{TE}$ and $F_{TM}$ vary with a wavelength $\lambda$ as either ($dF_{TE}/d\lambda>0$ and $dF_{TM}/d\lambda<0$) or ($dF_{TE}/d\lambda<0$ and $dF_{TM}/d\lambda>0$) within the wavelength band and for all angles within the range of angles of incidence.

50. The method of claim 49, wherein there is at least one the wavelength band that is within or near the wavelength bad for which parameter $F_{TE}$ is equal to parameter $F_{TM}$.

51. The method of claim 49, wherein the beamsplitter further includes a second optical surface inclined at an acute angle relative to the first optical surface, and the second portion of the light beam has a direction substantially normal to the second optical surface.

52. The method of claim 51, wherein the second surface is coated with an anti-reflective optical coating.

53. The method of claim 46, wherein the beam polarization direction varies with temperature over the operating-temperature range.

* * * * *